(12) United States Patent
Tooyama et al.

(10) Patent No.: US 7,471,230 B2
(45) Date of Patent: Dec. 30, 2008

(54) ANALOG-TO-DIGITAL CONVERTER AND SEMICONDUCTOR DEVICE

(75) Inventors: Takayuki Tooyama, Kanagawa (JP); Atsushi Suzuki, Kanagawa (JP); Noriyuki Fukushima, Kanagawa (JP); Yukihiro Yasui, Kanagawa (JP); Yoshikazu Nitta, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/937,860

(22) Filed: Nov. 9, 2007

(65) Prior Publication Data

US 2008/0094271 A1    Apr. 24, 2008

Related U.S. Application Data

(63) Continuation of application No. 11/428,970, filed on Jul. 6, 2006, now Pat. No. 7,321,329.

(30) Foreign Application Priority Data

Jul. 6, 2005  (JP) .............................. 2005-197044

(51) Int. Cl.
 *H03M 1/34*  (2006.01)
(52) U.S. Cl. ...................... 341/164; 341/120
(58) Field of Classification Search ............... 341/164, 341/120, 159, 155; 348/245
See application file for complete search history.

(56) References Cited

U.S. PATENT DOCUMENTS

| 5,877,715 | A | 3/1999 | Gowda |
| 6,344,877 | B1 * | 2/2002 | Gowda et al. ............... 348/245 |
| 2005/0168251 | A1 | 8/2005 | Lim |

FOREIGN PATENT DOCUMENTS

| EP | 1 107 581 | 6/2001 |
| EP | 1 566 891 | 8/2005 |

OTHER PUBLICATIONS

European Search Report dated Jan. 30, 2007.

* cited by examiner

*Primary Examiner*—Rexford Barnie
*Assistant Examiner*—Joseph Lauture
(74) *Attorney, Agent, or Firm*—Sonnenschein Nath & Rosenthal LLP

(57) ABSTRACT

An analog to digital converter comprising a reference signal generator, a comparator, and a counter wherein the reference signal generator is operable to generate a reference for converting an analog signal into a digital signal. The reference signal generator is also operable to generate a plurality of the reference signals based on the change in a voltage. The comparator is operable to compare the analog signal with the reference signal generated by the reference signal generator. The counter is operable to count, in parallel with a comparison performed by the comparator, a predetermined count clock and to hold a count value at the time of completion of the comparison.

6 Claims, 17 Drawing Sheets

ANALOG-TO-DIGITAL CONVERTER AND SEMICONDUCTOR DEVICE

RELATED APPLICATION DATA

This application is continuation of and claims the benefit of priority to U.S. application Ser. No. 11/428,970 filed on Jul. 6, 2006, which is incorporated herein by reference to the extent permitted by law. This application also claims the benefit of priority to Japanese Patent Application No. 2005-197044, filed Jul. 6, 2005, which is also incorporated herein by reference to the extent permitted by law.

BACKGROUND OF THE INVENTION

1. Field of the Invention

The present invention relates to analog-to-digital (AD) converters (abbreviated "ADC") and semiconductor devices, such as imagers, provided with the ADCs. More particularly, the present invention relates to the mechanism of so-called single-slope-integration or ramp-compare AD conversion for comparing a reference signal that changes with a predetermined slope with an analog signal to be processed and counting the comparison time.

2. Description of the Related Art

In electronic apparatuses, such as cameras, cellular phones, and imaging modules, various ADCs for converting an analog signal into a digital signal are used.

For example, physical-quantity-distribution sensing semiconductor devices including a line or a matrix of a plurality of unit elements (for example, pixels) responsive to electromagnetic waves, such as light or radiation, input from an external source are used in various fields.

In the video equipment field, for example, charge-coupled device (CCD), metal oxide semiconductor (MOS), or complementary metal-oxide semiconductor (CMOS) solid-state imagers for sensing light (an example of electromagnetic waves) as the physical quantity are used. Such imagers read the physical quantity distribution obtained by converting light into an electric signal using the unit elements (pixels in the solid-state imagers) as the electric signal. The word "solid-state" means that the imagers are made of semiconductor.

The solid-state imagers include amplifying solid-state imagers including active pixel sensor (abbreviated "APS" or called "gain cell") pixels provided with drive transistors for amplification disposed in pixel signal generators for generating pixel signals in accordance with signal charges generated by charge generators. For example, many of CMOS solid-state imagers have such a configuration.

In this type of APS imager, to read pixel signals to an external source, address control is performed on a pixel portion including an array of a plurality of unit pixels so that the signals are arbitrarily and selectively read from the individual unit pixels. That is, an APS imager is an example of an address-control solid-state imager.

For example, in an APS imager, which is one type of an X-Y address solid-state imager having unit pixels disposed in a matrix, MOS active elements (MOS transistors) are included in pixels so that the pixels themselves have an amplifying function. That is, signal charges (photoelectrons) stored in photodiodes, which are photoelectric conversion elements, are amplified by the active elements and read as image information.

In this type of X-Y address solid-stage imager, for example, many pixel transistors are disposed in a two-dimensional matrix to form a pixel portion, the accumulation of signal charges in accordance with incident light in each line (row) or each pixel is started, and current or voltage signals based on the accumulated signal charges are sequentially read from the individual pixels by addressing.

In MOS (including CMOS) solid-state imagers, an address control method for accessing the pixels in one row at one time and reading out the pixel signals from the pixel portion in units of rows is mostly used. The analog pixel signals read from the pixel portion are converted into digital signals using ADCs, if necessary, and then output to an external source (for example, see Japanese Unexamined Patent Application Publication Nos. 2000-152082 and 2002-232291 and U.S. Pat. Nos. 5,877,715, 5,920,274, and 6,344,877).

As has been described in these patent documents, there are various AD conversion methods in terms of the circuit scale, the processing speed, the resolution, etc. Among these methods, there is a so-called single-slope-integrating or ramp-compare AD conversion method for comparing an analog unit signal with an AD-conversion reference signal that changes monotonously, performing counting in parallel with comparison, and obtaining a digital signal of the unit signal on the basis of the count value at the time comparison is completed.

SUMMARY OF THE INVENTION

In a known single-slope-integrating AD conversion method, various signal lines for driving a plurality of voltage comparators are connected to common wiring. Noise generated in a voltage comparator is transmitted through the common wiring to the other voltage comparators, thereby influencing the operation of the other voltage comparators. As a result, an adverse effect is exerted on AD conversion.

In view of the above-described circumstances, it is desirable to propose the mechanism for avoiding adverse effect of noise generated in a voltage comparator on the operation of the other voltage comparators.

According to an embodiment of the present invention, there is provided an analog-to-digital converter including the following elements: a reference signal generator operable to generate a reference signal for converting an analog signal into a digital signal; a comparator operable to compare the analog signal with the reference signal generated by the reference signal generator; a counter operable to count, in parallel with comparison performed by the comparator, a predetermined count clock and to hold a count value at the time of completion of comparison performed by the comparator; and a reference signal supply interface unit operable to supply the reference signal generated by the reference signal generator to a plurality of comparators via different signal lines, respectively.

According to another embodiment of the present invention, there is provided a semiconductor device for sensing a physical quantity distribution, including the following elements: an effective region including, in each unit element, a charge generator operable to generate a charge corresponding to incident electromagnetic waves, and a unit signal generator operable to generate an analog unit signal in accordance with the charge generated by the charge generator; and function elements operable to convert the unit signal into digital data. The function elements include the following elements: a reference signal generator operable to generate a reference signal for converting the unit signal into digital data; a comparator operable to compare the unit signal with the reference signal generated by the reference signal generator; a counter operable to count, in parallel with comparison performed by the comparator, a predetermined count clock and to hold a count value at the time of completion of comparison performed by the comparator; and a reference signal supply interface unit operable to supply the reference signal generated by the reference signal generator to a plurality of comparators via different signal lines, respectively.

According to another embodiment of the present invention, there is provided a CMOS image sensor including the following elements: an imaging region; a reference signal generator operable to generate a reference signal; a comparator operable to compare the reference signal generated by the reference signal generator with a signal transmitted from the imaging region; a counter operable to count, in parallel with comparison performed by the comparator, a predetermined count clock and to hold a count value at the time of completion of comparison performed by the comparator; and a reference signal supply interface unit operable to supply the reference signal generated by the reference signal generator to a plurality of comparators via different signal lines, respectively.

According to another embodiment of the present invention, there is provided an electronic apparatus including a CMOS image sensor and a signal processor operable to process an output signal from the CMOS image sensor. The CMOS image sensor includes the following elements: an imaging region; a reference signal generator operable to generate a reference signal; a comparator operable to compare the reference signal generated by the reference signal generator with a signal transmitted from the imaging region; a counter operable to count, in parallel with comparison performed by the comparator, a predetermined count clock and to hold a count value at the time of completion of comparison performed by the comparator; and a reference signal supply interface unit operable to supply the reference signal generated by the reference signal generator to a plurality of comparators via different signal lines, respectively.

DESCRIPTION OF THE PREFERRED EMBODIMENTS

Preferred embodiments of the present invention will be described in detail below with reference to the accompanying drawings. In the following description, the case in which a CMOS imager, which is an example of an X-Y address solid-stage imager, is used as a device will be described by way of example. Also in this description, it is assumed that all pixels in the CMOS imager are of NMOS or PMOS type.

However, this is only an example, and the device is not limited to a MOS imaging device. All the embodiments described below are similarly applicable to all physical-quantity-distribution sensing semiconductor devices including a line or a matrix of a plurality of unit elements responsive to electromagnetic waves, such as light or radiation, input from an external source.

In the embodiments of the present invention, an imager is a general term for a physical information obtaining device for obtaining physical information for a predetermined purpose on the basis of unit signals obtained under predetermined sensing conditions regarding the physical quantity. Specifically, the physical information obtaining device includes a physical quantity distribution sensor in which unit elements are arranged in a predetermined order and includes, in these unit elements, a plurality of sensors for sensing a change in physical quantity and unit signal generators for outputting unit signals based on the changes in physical quantity sensed by the individual sensors.

Configuration of Solid-State Imager

Figure 1:
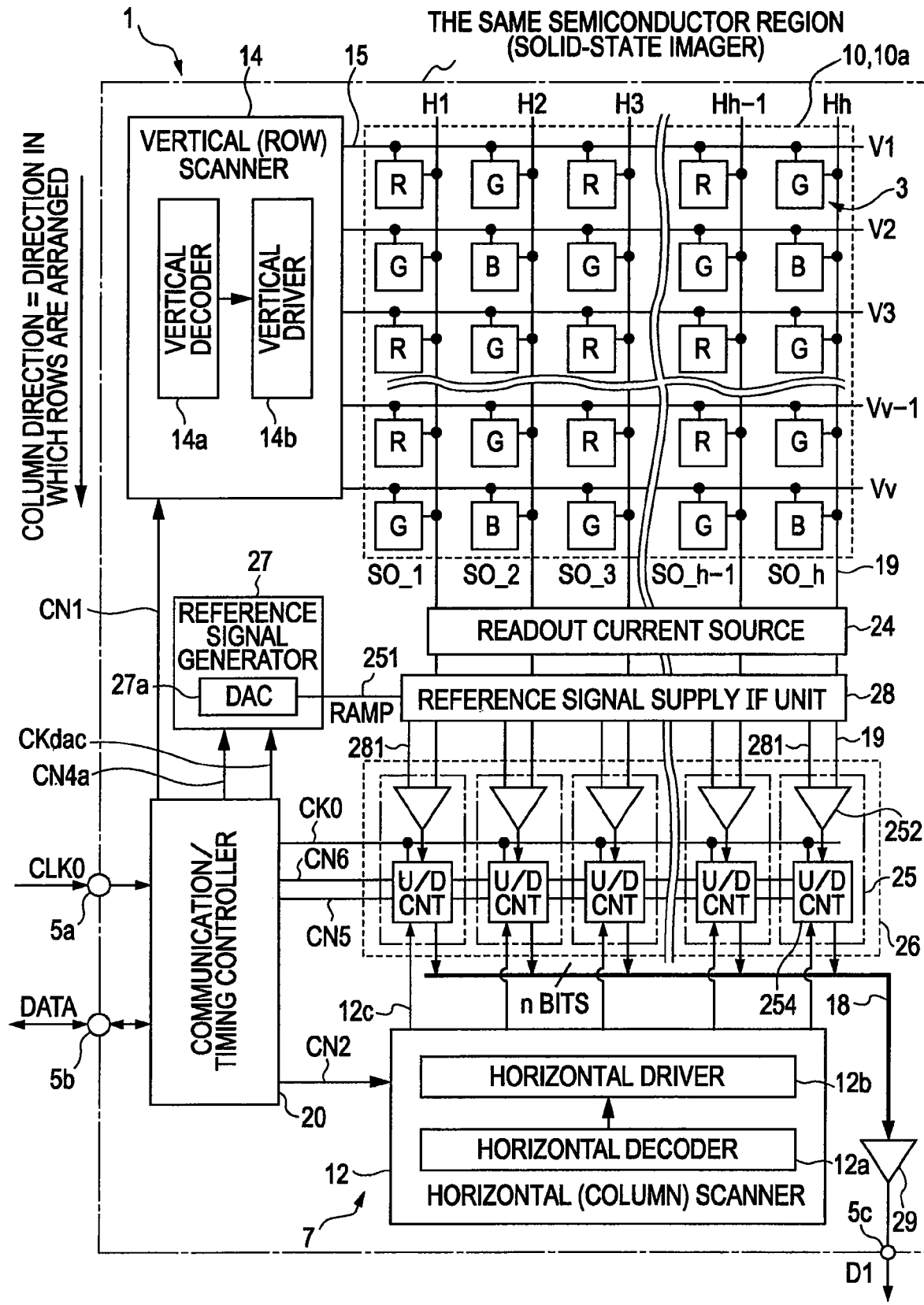
FIG. 1 is a diagram of the schematic configuration of a CMOS solid-stage imager, which is an example of a semiconductor device according to a first embodiment of the present invention.

FIG. 1 schematically shows the configuration of a CMOS solid-state imager (CMOS image sensor), which is an example of a semiconductor device according to a first embodiment of the present invention. The CMOS solid-state imager is one example of an electronic apparatus.

A solid-stage imager 1 includes a pixel portion including a plurality of pixels arranged in rows and columns (i.e., in a two-dimensional matrix), each pixel including a light-receiving element (an example of a charge generator) for outputting a signal in accordance with the quantity of incident light. A signal output from each pixel is a voltage signal. In the solid-stage imager 1, correlated double sampling (CDS) functions and analog-to-digital converters (ADCs) are disposed in a column-parallel manner.

The phrase "CDS functions and ADCs are disposed in a column-parallel manner" means that a plurality of CDS functions and ADCs are provided substantially in parallel with respect to vertical signal lines 19 in vertical columns. The plurality of functions may be disposed only on the side of one end in the column direction of a pixel portion (imaging portion) 10 (the output side in the lower part of FIG. 1), when the device is viewed in plan. Alternatively, the functions may be separately disposed on the side of one end in the column direction of the pixel portion 10 (the output side in the lower part of FIG. 1) and on the other side opposite to the one end (in the upper part of FIG. 1). In the latter case, it is preferable that horizontal scanners for performing readout scanning (horizontal scanning) in the row direction be disposed on both sides of the pixel portion 10, so that the horizontal scanners can operate independently.

A typical example in which CDS functions and ADCs are disposed in a column-parallel manner is a column-type imager. In this type of imager, CDS functions and ADCs are disposed in the individual vertical columns in a portion referred to as a column area disposed at the output side of the imaging portion, and signals are sequentially read out to the output side. Alternatively, for example, one CDS function and one ADC may be assigned to a plurality of (for example, two) adjacent vertical signal lines 19 (vertical columns), or one CDS function and one ADC may be assigned to N vertical signal lines 19 (vertical columns) in N other lines (N is a positive integer; there are (N−1) lines between two sets).

In any of the forms other than the column type, since one CDS function and one ADC are commonly used for a plurality of vertical signal lines 19 (vertical columns), a switch circuit (switch) is provided for supplying pixel signals associated with a plurality of columns from the pixel portion 10 to one CDS function and one ADC. A memory for storing output signals may be necessary depending on the processing of the subsequent stage.

By assigning one CDS function and one ADC to a plurality of vertical signal lines 19 (vertical columns), signal processing can be performed on pixel signals after the pixel signals are read in units of pixel columns. Accordingly, compared to the case where similar signal processing is performed in each unit pixel, the configuration of each unit pixel can be simplified, and a multi-pixel, smaller, and less expensive image sensor can be implemented.

Additionally, a plurality of signal processors disposed in a column-parallel manner can simultaneously process one row of pixel signals. Accordingly, compared to the case where processing is performed with one CDS function and one ADC in an output circuit or outside the device, the signal processors can be operated at a lower speed, which is more advantageous in terms of the power consumption, the band performance, and noise. In other words, when the power consumption and the band performance are the same, the operation of the overall sensor becomes faster.

The column-type imager, which can operate at a lower speed, is advantageous in terms of the power consumption, the band performance, or noise, and is also advantageous in that a switch circuit (switch) is unnecessary. In the following embodiments, it should be assumed that the column-type imager is used unless otherwise stated.

The solid-state imager 1 includes, as shown in FIG. 1, the pixel portion (imaging portion) 10 in which a plurality of generally square unit pixels (an example of unit elements) 3 are disposed in rows and columns (i.e., in a square lattice), a driving controller 7 disposed outside the pixel portion 10, a readout current supply 24 for supplying an operating current (readout current) for reading out pixel signals to the unit pixels 3 included in the pixel portion 10, a column processor 26 including column AD circuits 25 disposed in the individual vertical lines, a reference signal generator 27 for supplying a reference voltage for AD conversion to the column processor 26, a reference signal supply interface (IF) unit 28 for supplying the reference signal generated by the reference signal generator 27 to each column AD circuit 25 included in the column processor 26, and an output circuit 28, which are disposed outside the pixel portion 10. These functions are provided on the same semiconductor substrate.

If necessary, before or after the column processor 26, an auto gain control (AGC) circuit having a signal amplifying function may be disposed in the same semiconductor region in which the column processor 26 is disposed. If AGC is performed prior to the column processor 26, analog amplification is performed, and if AGC is performed subsequent to the column processor 26, digital amplification is performed. If an n-bit digital signal is directly amplified, the grayscale may be impaired. It is thus preferable that analog amplification be performed prior to performing digital conversion.

The driving controller 7 is provided with a control circuit function of sequentially reading out signals from the pixel portion 10. For example, the driving controller 7 includes a horizontal scanner (column scanning circuit) 12 for controlling column addressing and column scanning, a vertical scanner (row scanning circuit) 14 for controlling row addressing and row scanning, and a communication/timing controller 20 having a function of, for example, generating an internal clock.

Although some of the rows and columns are not shown in FIG. 1 to simplify the diagram, in actuality, several tens of to several thousands unit pixels 3 are disposed in each row and each column to form the pixel portion 10. In the pixel portion 10, an effective portion 10a is a portion of the pixel portion 10 excluding reference pixel areas including black pixels disposed at the top, bottom, right, and left of the pixel portion 10. Typically, each unit pixel 3 includes a photodiode serving as a light-receiving element (charge generator) and an in-pixel amplifier having an amplifying semiconductor element (e.g., a transistor).

As the in-pixel amplifier, for example, a floating diffusion amplifier can be used. For example, an in-pixel amplifier having four transistors, which are generally used in a CMOS sensor, including a readout selection transistor, which is an example of a charge readout unit (transfer gate/readout gate), a reset transistor, which is an example of a reset gate, a vertical selection transistor, and a source-follower amplifying transistor, which is an example of a sensor for sensing a change in potential of the floating diffusion, can be used for each charge generator.

Alternatively, as described in Japanese Patent Publication No. 2708455, an in-pixel amplifier having three transistors including an amplifying transistor connected to a drain line (DRN) for amplifying a signal voltage corresponding to a signal charge generated by the associated charge generator, a reset transistor for resetting the charge generator, and a readout selection transistor (transfer gate) which is scanned by a vertical shift register via a transfer line (TRF) may be used.

Since the solid-stage imager 1 has a color separation filter, the pixel portion 10 can handle color imaging. More specifically, one of a plurality of color filters included in the color separation filter (the color filters are of a combination of a plurality of colors) for performing color imaging, which is arranged in, for example, a Bayer pattern, is disposed on the light-receiving surface for receiving electromagnetic waves (light in this embodiment) of each charge generator (such as a photodiode) included in the pixel portion 10, thereby enabling color imaging.

The unit pixels 3 are connected to the vertical scanner 14 via row control lines 15 for selecting rows and are also connected via the vertical signal lines 19 to the column processor 26 including the column AD circuits 25 disposed in the individual vertical columns. The row control lines 15 represent the overall wiring from the vertical scanner 14 to the pixels.

The horizontal scanner 12 has a readout scanning function of reading out count values from the column processor 26. The elements, such as the horizontal scanner 12 and the vertical scanner 14, included in the driving controller 7 are integrally formed, with the pixel portion 10, in a semiconductor region, such as a monocrystal silicon, by using a technique similar to a semiconductor integrated circuit manufacturing technique, thereby forming a solid-state imager (imaging device), which is an example of a semiconductor system.

Each of the horizontal scanner 12 and the vertical scanner 14 has a decoder, which is described below, and starts the shifting operation (scanning) in response to control signals CN1 and CN2 supplied from the communication/timing controller 20. Accordingly, various pulse signals (for example, a reset pulse RST, a transfer pulse TRF, and a DRN control pulse DRN) for driving the unit pixels 3 are contained in the row control lines 15.

Although it is not shown, the communication/timing controller 20 has a functional block of a timing generator TG (an example of a readout address controller) for supplying clocks and predetermined timing pulse signals, which are necessary for the operation of each element, and a functional block of a communication interface for receiving a master clock CLK0 via a terminal 5a, receiving data DATA indicating the operation mode or the like via a terminal 5b, and outputting data containing information regarding the solid-state imager 1.

For example, the communication/timing controller 20 outputs a horizontal address signal to a horizontal decoder 12a and a vertical address signal to a vertical decoder 14a, and each of the decoders 12a and 14a receives the corresponding address signal to select the corresponding row or column.

In this case, since the unit pixels 3 are disposed in a two-dimensional matrix, high-speed reading of the pixel signals and pixel data is preferably performed in the following manner. Vertical scanning is performed such that analog pixel signals generated by pixel signal generators 5 and output in the column direction via the vertical signal lines 19 are accessed and read in units of rows (in a column-parallel manner), and then, horizontal scanning is performed such that pixel signals (digital pixel data in this embodiment) are accessed in the row direction, which is the direction in which the vertical columns are arranged, and are read out to the output side. The reading of the pixel signals and pixel data is not restricted to scanning, and random access may be performed by directly addressing the unit pixels 3 to be read out so that information only concerning the necessary unit pixels 3 can be read.

The communication/timing controller 20 supplies a clock CLK1 having the same frequency as that of the master clock CLK0 input via the terminal 5a and a low-speed clock which is scaled down to a half of the clock CLK1 or lower to the elements included in the device, such as the horizontal scanner 12, the vertical scanner 14, and the column processor 26. The clocks scaled down to a half of the master clock or lower are collectively referred to as the "low-speed clock CLK2".

The vertical scanner 14 selects rows of the pixel portion 10 and supplies necessary pulses to the selected rows. For example, the vertical scanner 14 includes the vertical decoder 14a for specifying rows in the vertical direction (rows of the pixel portion 10) to be read and a vertical driver 14b for supplying pulses to the row control lines 15 corresponding to the unit pixels 3 at the readout addresses (rows) specified by the vertical decoder 14a and driving the unit pixels 3. In addition to reading out the signals, the vertical decoder 14a selects a row used for an electronic shutter.

The horizontal scanner 12 sequentially selects the column AD circuits 25 included in the column processor 26 in synchronization with the low-speed clock CLK2, and outputs the corresponding signals to a horizontal signal line (horizontal output line) 18. For example, the horizontal scanner 12 includes the horizontal decoder 12a for specifying columns in the horizontal direction to be read (selecting the column AD circuits 25 included in the column processor 26) and a horizontal driver 12b for outputting the signals from the column processor 26 to the horizontal signal line 18 in accordance with the readout addresses specified by the horizontal decoder 12a. If the number of bits handled by the column AD circuits 25 is n (n is a positive integer), for example, 10 (=n) bits, the horizontal signal line 18 includes 10 lines in accordance with the number of bits.

In the solid-state imager 1 configured as described above, the pixel signals output from the unit pixels 3 of each vertical column are supplied via the associated vertical signal line 19 to the associated column AD circuit 25 included in the column processor 26.

Each column AD circuit 25A included in the column processor 26 receives analog signals So for one column and processes the analog signals So. Each column AD circuit 25 has, for example, an ADC circuit for converting an analog signal into, for example, a 10-bit digital signal, by using, for example, the low-speed clock CLK2.

To perform AD conversion, the column processor 26 performs row-parallel AD conversion of analog signals held in parallel in units of rows into digital signals using the column AD circuits 25 disposed in the individual columns. In this case, a single-slope-integrating (or ramp-compare) AD conversion technique described in, for example, Japanese Patent Publication No. 2532374 or an article entitled "Column-kan FPN no nai column-gata AD-henkanki wo tousaishita CMOS image sensor (CMOS image sensor with column-type ADCs without inter-column FPN)", The Institute of Image Information and Television Engineers, IPU2000-57, pp. 79-84. Since this technique only involves a simple structure to implement each AD converter, this technique is advantageous in that the circuit scale is not increased when AD converters are disposed in parallel with one another.

The configuration of the ADC circuit is described subsequently in detail. On the basis of the time from the conversion start until a reference voltage RAMP coincides with a signal voltage to be processed, the ADC circuit converts an analog signal to be processed into a digital signal. Basically, the mechanism for implementing this conversion involves supplying the ramp reference voltage RAMP to a comparator (voltage comparator) and at the same time starting counting a clock signal. Counting is continued until a pulse signal is obtained by comparing an analog pixel signal input via the vertical signal line 19 with the reference voltage RAMP, thereby performing AD conversion.

In this case, the circuit configuration is modified to perform, in addition to AD conversion, calculation of the difference between the signal level (noise level) immediately after resetting the pixel and the true signal level Vsig (based on the quantity of the received light) for a voltage-mode pixel signal input via the vertical signal line 19. With this arrangement, noise signal components, such as fixed pattern noise (FPN) or reset noise, can be eliminated.

Pixel data digitized in each column AD circuit 25 is transferred to the horizontal signal line 18 via a horizontal selection switch (not shown) driven by a horizontal selection signal supplied from the horizontal scanner 12, and is input to the output unit 29. The 10-bit digital signal is an example only, and the number of bits may be smaller than ten (for example, eight bits) or larger than ten (for example, 14 bits).

With the above-described configuration, the pixel portion 10 including a matrix of light-receiving elements serving as the charge generators sequentially outputs pixel signals of the associated vertical columns in units of rows. Then, an image corresponding to the pixel portion 10 in which the light-receiving elements are arranged in a matrix, namely, a frame image, is represented using a set of pixel signals of the entire pixel portion 10.

Details of Reference Signal Generator and Column AD Circuit

The reference signal generator 27 includes a digital-to-analog converter (DAC) circuit 27a, which is a functional element for generating a reference signal for AD conversion. In order to handle color imaging, the reference signal generator 27 preferably includes DAC circuits, which are functional elements for generating reference signals for AD conversion, in accordance with the types and the arrangement of colors of color filters included in the color separation filter in the pixel portion 10 so that individual reference signals with color-dependent variation characteristics (slope) and initial values can be supplied to the comparator circuits. In addition, the reference signal generator 27 preferably includes a switching mechanism for handling the switching of color to be processed in response to the switching of a row to be processed.

Accordingly, the number of reference voltage generators (corresponding to the DAC circuits in this embodiment) and the number of lines from the reference voltage generators can be reduced to be less than the number of color filters included in the color separation filter. Selectors (multiplexers) disposed for the individual vertical columns for selectively outputting an analog reference voltage (corresponding to the reference signal in this embodiment) from each reference voltage generator, which is necessary in the case where the reference voltage generator is provided for each color filter, become unnecessary. As a result, the circuit scale can be reduced. In addition, the number of signal lines for transmitting the reference signals in accordance with the color pixels to comparators at the input side thereof is reduced to be less than the number of color components of the color filters for capturing a color image.

Control data CN4 supplied from the communication/timing controller 20 to the DAC circuit 27a included in the reference signal generator 27 contains information indicating the slope (the degree of change; the amount of change over time) of the ramp voltage for each comparison and the initial value.

The DAC circuit 27a receives a count clock CKdac for DAC from the communication/timing controller 20, generates a linearly-decreasing stepped-ramp saw tooth wave (ramp waveform) in synchronization with the count clock CKdac, and supplies the generated saw tooth wave as an AD conversion reference voltage (ADC reference signal) via the reference signal RAMP to the individual column AD circuits 25. The slope of the reference signal RAMP is changed by, for example, adjusting the cycle of the count clock CKdac, thereby adjusting the coefficient of difference computation described below and controlling the analog gain in AD conversion.

The column AD circuits 25 have an n-bit ADC function. Specifically, each column AD circuit 25 includes a voltage comparator (comparator) 252 for comparing the reference signal RAMP generated in the DAC circuit 27a of the reference signal generator 27 with an analog pixel signal supplied from the associated unit pixel 3 disposed in each row control line 15 (V1, V2, . . . ) via the associated vertical signal line 19 (H1, H2 . . . ) and a counter 254 for counting the time until the voltage comparator 252 completes comparison and for storing the counting result.

The communication/timing controller 20 has a function of controlling the count mode of each counter 254 in accordance with whether a reset component ΔV or a signal component Vsig of the pixel signal is used for comparison in the associated voltage comparator 252. A control signal CN5 for designating whether the counter 254 is operated in a down-count mode or an up-count mode is input from the communication/timing generator 20 into the counter 254 of each column AD circuit 25.

The reference signal supply IF unit 28 receives the reference signal generated by the reference signal generator 27 via a reference signal line 251 and outputs the reference signal to reference signal output lines 281. The stepped-ramp reference signal RAMP generated by the reference signal generator 27 is input into one input terminal RAMP of each of the voltage comparators 252 from the associated reference signal output line 281 via the reference signal supply IF unit 28, which is a feature of this embodiment, and the other input terminals of the voltage comparators 252 are connected to the associated vertical signal lines 19 in vertical columns and receive pixel signal voltages from the pixel portion 10.

Two types of reset signals PSET and NSET and other control signals (may collectively be referred to as a "comparison control signal CN7") are supplied from the communication/timing controller 20 to the voltage comparators 252. The output signals from the voltage comparators 252 are supplied to the associated counters 254, respectively.

A count clock CK0 is commonly input to the clock terminals CK of the counters 254 from the communication/timing controller 20.

Although the configuration of each counter 254 is not shown, each counter 254 can be implemented by changing the wiring arrangement of a data storage device generally formed of a latch into a synchronous counter, and the internal counting is performed by receiving one count clock CK0. The n-bit counter 254 can be implemented by a combination of n latches, and the circuit scale can be reduced to one half of the circuit scale of a data storage device formed of two blocks, each having n latches. Additionally, the provision of a counter in each column becomes unnecessary, and the overall configuration becomes much smaller.

Although details of the counters 254 are given below, by the use of the common up/down counter (U/D CNT) regardless of the count mode, counting can be performed by switching (alternating in a specific sense) between the down-count operation and the up-count operation. A synchronous counter for outputting a count output value in synchronization with the count clock CK0 is used as each counter 254.

In the case of the synchronous counter, the operation of all the flip-flops (counter basic elements) is restricted by the count clock CK0. Thus, if a higher frequency operation is necessary, the use of an asynchronous counter suitable for the high-speed operation is preferable since the operation limit frequency is determined only by the limit frequency of the first flip-flop (counter basic element).

A control pulse is input from the horizontal scanner 12 into each counter 254 via an associated control signal line 12c. Each counter 254 has a latch function of latching the counting result and latches the count output value until an instruction is given in the form of a control pulse received via the associated control line 12c.

The column AD circuits 25 configured as described above are disposed for the associated vertical signal lines 19 (H1, H2, . . . ), respectively, to form the column processor 26, which is a column-parallel ADC block.

The column AD circuits 25 are connected at their output ends to the horizontal signal line 18. As described above, the horizontal signal line 18 includes the n number of signal lines, in which "n" corresponds to the bit width of each column AD circuit 25, and the horizontal signal line 18 including the n signal lines is connected to the output circuit 29 via n sensing circuits (not shown) corresponding to output lines.

With this configuration, during the pixel signal readout period, each column AD circuit 25 performs a counting operation and outputs the counting result at a predetermined time. More specifically, each voltage comparator 252 first compares the ramp waveform voltage from the reference signal generator 27 with the pixel signal voltage input via the associated vertical signal line 19 and, when the two voltages become equal to each other, the comparator output of the voltage comparator 252 is inverted (from the high level to the low level in this embodiment).

The counter 254 has already started counting in the down-count mode or the up-count mode in synchronization with the ramp waveform voltage generated by the reference signal generator 27 and, when the counter 254 is informed that the comparator output is inverted, the counter 254 stops counting and latches (holds/stores) the count value at that time as pixel data, thereby completing AD conversion.

Thereafter, the counter 254 sequentially outputs the stored pixel data to the outside the column processor 26 or to the outside the chip having the pixel portion 10 via an output terminal 5c on the basis of the shifting operation using a horizontal selection signal CH(i) input from the horizontal scanner 12 via the control line 12c at a predetermined time.

Other various signal processing circuits may be contained in the elements of the solid-state imagers 1, though they are not shown since they are not directly related to this embodiment.

Pixel Portion

Figure 2A:
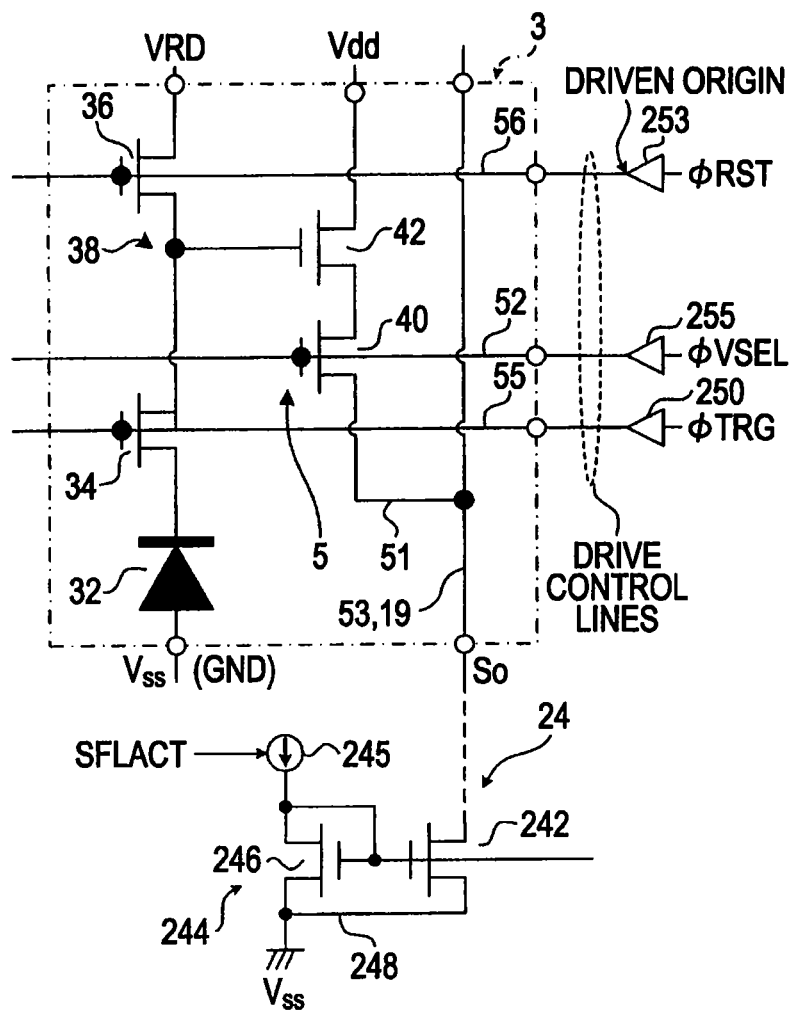
FIGS. 2A and 2B are diagrams showing examples of the configuration of a unit pixel and the connections among drivers, drive control lines, and pixel transistors.
Figure 2B:
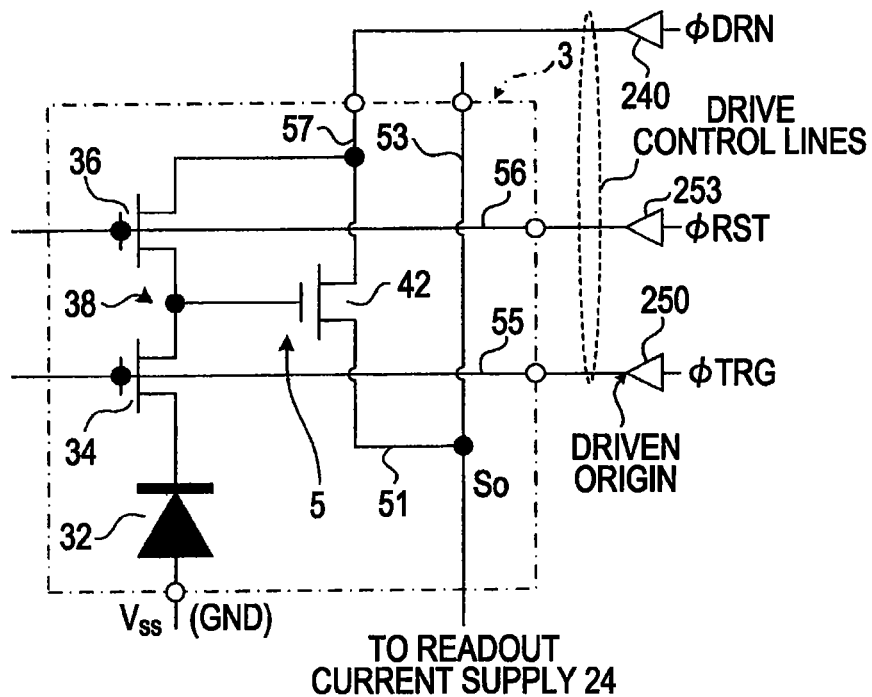

FIGS. 2A and 2B show examples of the configuration of each unit pixel 3 used in the solid-stage imager 1 shown in FIG. 1 and the connections among drivers, drive control lines, and pixel transistors. The configuration of each unit pixel (pixel cell) 3 in the pixel portion 10 is similar to that in a general CMOS image sensor. In this embodiment, a 4TR structure generally used in a CMOS sensor or a 3TR structure including three transistors, such as that described in Japanese Patent Publication No. 2708455, can be used. Needless to say, these pixel configurations are only examples, and any configuration can be used as long as each unit pixel 3 includes an array configuration in a general CMOS image sensor array.

As an in-pixel amplifier, for example, a floating diffusion amplifier can be used. For example, an in-pixel amplifier having four transistors (hereinafter may also be referred to as a "4TR structure"), which is generally used in a CMOS sensor, including a readout selection transistor, which is an example of a charge readout unit (transfer gate/readout gate), a reset transistor, which is an example of a reset gate, a vertical selection transistor, and a source-follower amplifying transistor, which is an example of a sensor for sensing a change in potential of the floating diffusion, can be used for each charge generator.

For example, the unit pixel 3 having a 4TR structure shown in FIG. 2A includes a charge generator 32, which serves as a photoelectric conversion function for receiving light and converting the received light into an electric charge and also as a charge accumulation function for accumulating the electric charge, and, for the charge generator 32, a readout selection transistor (transfer transistor) 34, which is an example of a charge readout unit (transfer gate/readout gate), a reset transistor 36, which is an example of a reset gate, a vertical selection transistor 40, and a source-follower amplifying transistor 42, which is an example of a sensor for sensing a change in potential of the floating diffusion 38.

The unit pixel 3 includes a floating diffusion amplifier (FDA) pixel signal generator 5 including the floating diffusion 38, which is an example of a charge injection element having a charge accumulation function. The floating diffusion 38 is a diffusion layer having a parasitic capacitance.

The readout selection transistor (second transfer portion) 34 is driven via a transfer line (readout selection line TX) 55 by a transfer driving buffer 250 to which a transfer signal .phi.TRG is supplied. The reset transistor 36 is driven via a reset line (RST) 56 by a reset driving buffer 253 to which a reset signal .phi.RST is supplied. The vertical selection transistor 40 is driven via a vertical selection line (SEL) 52 by a selection driving buffer 255 to which a vertical selection signal .phi.VSEL is supplied. The driving buffers 250, 253, and 255 can be driven by the vertical driver 14b of the vertical scanner 14.

The reset transistor 36 in the pixel signal generator 5 is connected at its source to the floating diffusion 38 and at its drain to a power supply Vdd, and the reset pulse RST is input into the gate (reset gate RG) of the reset transistor 36 from the reset driving buffer 253.

For example, the vertical selection transistor 40 is connected at its drain to the source of the amplifying transistor 42, at its source to a pixel line 51, and at its gate (particularly referred to as the "vertical selection gate SELV") to the vertical selection line 52. Alternatively, the vertical selection transistor 40 may be connected at its drain to the power supply Vdd and at its source to the drain of the amplifying transistor 42, and the vertical selection gate SELV may be connected to the vertical selection line 52.

The vertical selection signal VSEL is applied to the vertical selection line 52. The amplifying transistor 42 is connected at its gate to the floating diffusion 38, at its drain to the power supply Vdd via the vertical selection transistor 40, and at its source to the pixel line 51 and to a vertical signal line 53 (19).

One end of the vertical signal line 53 extends toward the column processor 26, and the vertical signal line 53 is connected to the readout current supply 24 on the path toward the column processor 26, thereby forming a source follower configuration in which substantially a constant operating current (readout current) is supplied between the vertical signal line 53 and the amplifying transistor 42.

Specifically, the readout current supply 24 includes an NMOS transistor (particularly referred to as a "load MOS transistor") 242 disposed in each vertical column and a reference current source 244 including a current generator 245 shared by all the vertical columns and an NMOS transistor 246 whose gate and drain are commonly connected and whose source is connected to a source line 248.

The load NMOS transistors 242 are connected such that the drains thereof are connected to the associated vertical signal lines 53 disposed in the columns and the sources thereof are commonly connected to the source line 248 serving as a ground line. Accordingly, the gate of the load MOS transistor 242 disposed in each vertical column is connected to the gate of the NMOS transistor 246 included in the reference current source 244, thereby forming a current mirror circuit.

The source line 248 is connected at its ends in the horizontal direction (vertical columns shown on the left and right of FIG. 1) to ground (GND), which is a substrate bias. The operating current (readout current) with respect to the grounding of the load NMOS transistor 242 is supplied from both left and right ends of the chip.

A load control signal SFLACT for allowing the current generator 245 to output a predetermined current only when necessary is supplied from a load controller (not shown) to the current generator 245. When reading out a signal, the current generator 245 having received the active load control signal SFLACT continuously allows a predetermined constant current to flow using the load NMOS transistor 242 connected to the amplifying transistor 42. In other words, the load NMOS transistor 242 forms, together with the amplifying transistor 42 disposed in a selected row, a source follower and supplies the readout current to the amplifying transistor 42, thereby outputting a signal to the vertical signal line 53.

In the 4TR structure described above, since the floating diffusion 38 is connected to the gate of the amplifying transistor 42, the amplifying transistor 42 outputs a signal corresponding to a potential (hereinafter referred to as an "FD potential") of the floating diffusion 38 in a voltage mode via the pixel line 51 to the vertical signal line 53 (19).

The reset transistor 36 resets the floating diffusion 38. The readout selection transistor (transfer transistor) 34 transfers the signal charge generated by the charge generator 32 to the floating diffusion 38. Many pixels are connected to each vertical signal line 19. In order to select a pixel, only the vertical selection transistor 40 in a pixel to be selected is switched on. In response to this, only the selected pixel is connected to the associated vertical signal line 19, and a signal of the selected pixel is output to the vertical signal line 19.

In contrast, with the structure including the charge generator and three transistors (hereinafter may also be referred to as a "3TR structure"), the area occupied by the transistors in each unit pixel 3 is reduced, and hence the pixel size can be reduced (for example, see Japanese Patent Publication No. 2708455).

For example, each unit pixel 3 with a 3TR structure shown in FIG. 2B includes the charge generator 32 (e.g., a photodiode) for performing photoelectric conversion to generate a signal charge in accordance with the received light, the amplifying transistor 42 connected to the drain line (DRN) for amplifying a signal voltage corresponding to the signal charge generated by the charge generator 32, the reset transistor 36 for resetting the charge generator 32, and the readout selection transistor (transfer gate) 34 scanned by the vertical scanner 14 (not shown) via the transfer line (TRF) 55, which is disposed between the charge generator 32 and the gate of the amplifying transistor 42.

The gate of the amplifying transistor 42 and the source of the reset transistor 36 are connected to the charge generator 32 via the readout selection transistor 34, the drain of the reset transistor 36 and the drain of the amplifying transistor 42 are connected to the drain line, and the source of the amplifying transistor 42 is connected to the vertical signal line 53.

The readout selection transistor 34 is driven via the transfer line 55 by the transfer driving buffer 250. The reset transistor 36 is driven via the reset line 56 by the reset driving buffer 253.

Both the transfer driving buffer 250 and the reset driving buffer 253 operate at two voltages, that is, 0V serving as a reference voltage and the power supply voltage. In particular, a low-level voltage supplied to the gate of the readout selection transistor 34 in this pixel is 0V.

In each unit pixel 3 having this 3TR structure, as in the 4TR structure, the floating diffusion 38 is connected to the gate of the amplifying transistor 42. Thus, the amplifying transistor 42 outputs a signal corresponding to the potential of the floating diffusion 38 to the vertical signal line 53.

Regarding the reset transistor 36, the reset line (RST) 56 extends in the row direction, and the drain line (DRN) 57 is common to substantially all the pixels. This drain line 57 is driven by a drain driving buffer (hereinafter referred to as a "DRN driving buffer") 240 to which a drain driving signal .phi. DRN is supplied. The reset transistor 36 is driven by the reset driving buffer 253 and controls the potential of the floating diffusion 38.

The drain line 57 is separated in the row direction. Since the drain line 57 is supposed to allow signal currents of one row of pixels to flow, the drain line 57 is actually shared by all the rows so that the current can be allowed to flow in the column direction. The signal charge generated by the charge generator (photoelectric conversion element) 32 is transferred by the readout selection transistor 34 to the floating diffusion 38.

Unlike the 4TR structure, the unit pixel 3 having the 3TR structure has no vertical selection transistor 40 connected in series to the amplifying transistor 42. Many pixels are connected to the vertical signal line 53. A pixel is selected not using a selection transistor, but by controlling the FD potential. Normally, the FD potential is "low". To select a pixel, the FD potential of a pixel to be selected is changed to "high", thereby outputting a signal of the selected pixel to the vertical signal line 53. Subsequently, the FD potential of the selected pixel is changed back to "low". This operation is simultaneously performed on one row of pixels.

In order to control the FD potential in this manner, the following operation is performed: 1) the drain line 57 is changed to "high" when changing the FD potential of the selected row to "high", and the FD potential is changed to "high" through the reset transistor 36 in the selected row, and 2) the drain line 57 is changed to "low" when changing the FD potential of the selected row back to "low", and the FD potential is changed to "low" through the reset transistor 36 in the selected row.

In order to drive the pixel portion 10 including the unit pixels 3 with the 4TR or 3TR structure, the transistors 34, 36, 40, 42 (may also be collectively referred to as "pixel transistors") included in each unit pixel 3 are driven via the lines 52, 55, 56, and 57 (may also be collectively referred to as "drive control lines") using the driving buffers 240, 250, 253, and 255 (may also be collectively referred to as "drivers").

Operation of Solid-State Imager

Figure 3:
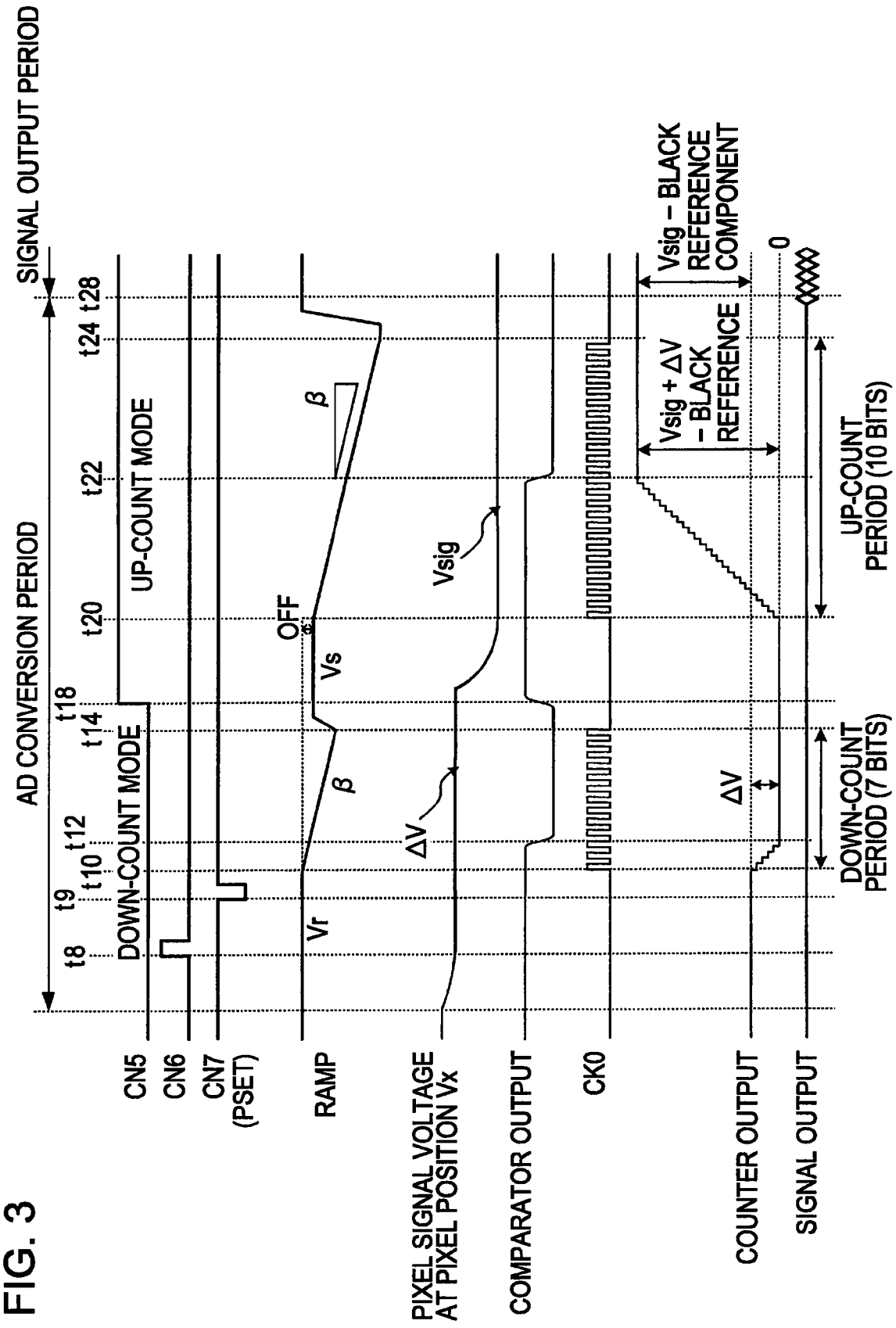
FIG. 3 is a timing chart (part 1) for illustrating a signal difference obtaining process, which is the basic operation of a column AD circuit.
Figure 4:
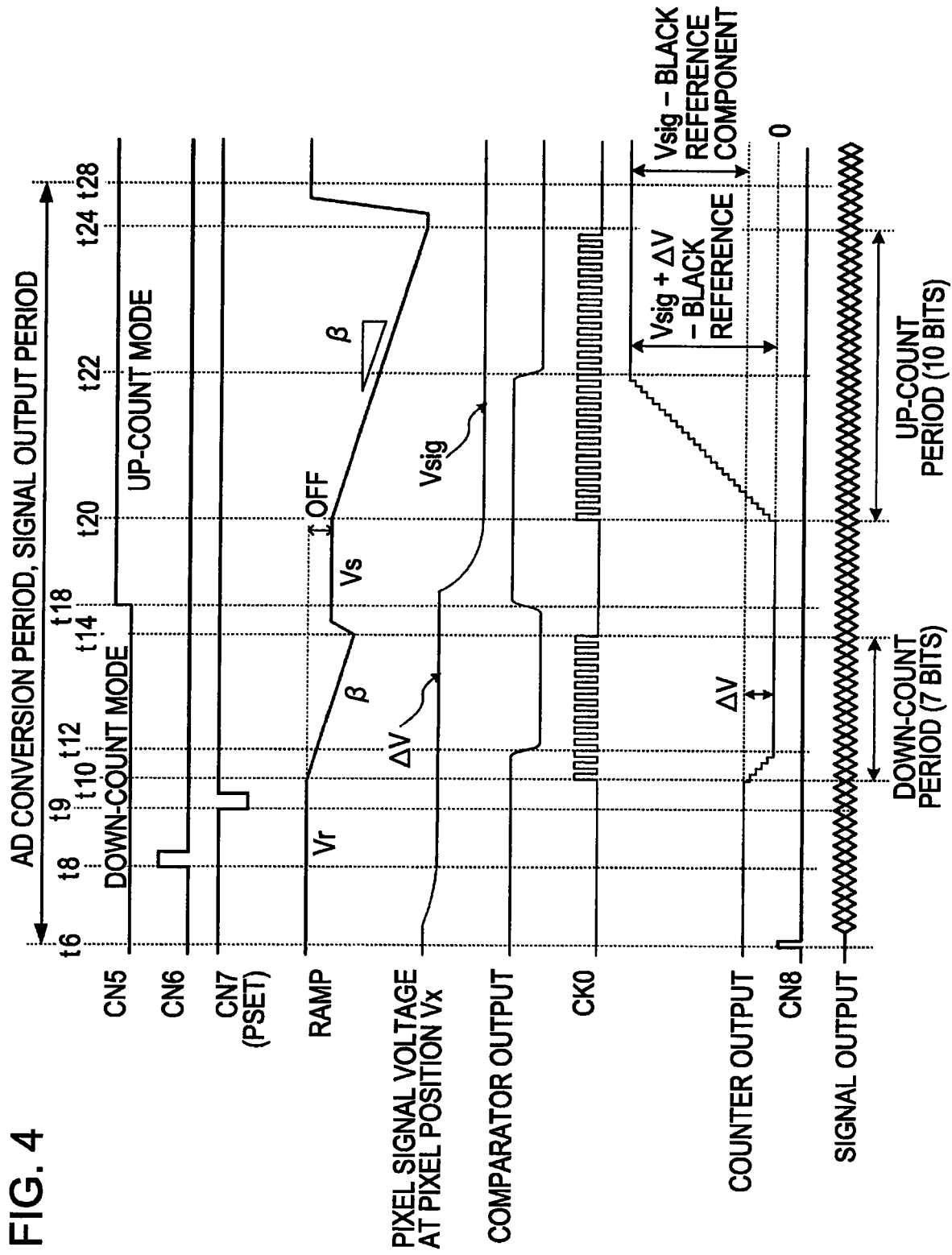
FIG. 4 is a timing chart (part 2; pipeline process) for illustrating the signal difference obtaining process, which is the basic operation of the column AD circuit.

FIGS. 3 and 4 are timing charts illustrating a signal difference obtaining process, which is the basic operation, performed by each column AD circuit 25 of the solid-state imager 1 shown in FIG. 1.

The mechanism for converting an analog pixel signal sensed in each unit pixel 3 of the pixel portion 10 into a digital signal involves, for example, the following. The point at which the ramp waveform reference signal RAMP, which decreases with a predetermined slope, becomes equal to the voltage of a reference component or a signal component of the pixel signal from each unit pixel 3 is detected, and the time from the generation of the reference signal RAMP for use in comparison to the point at which the reference signal RAMP coincides with the electric signal corresponding to the reference component or the signal component of the pixel signal is counted using the count clock, thereby obtaining the count value corresponding to the level of the reference component or the signal component.

Each pixel signal output from the vertical signal lines 19 includes, in a time sequence, the signal component Vsig appearing subsequent to the reset component $\Delta V$ serving as the reference component containing noise of the pixel signal. If the first operation is performed on the reference component (reset component $\Delta V$), the second operation is performed on the signal obtained by adding the signal component Vsig to the reference component (reset component $\Delta V$). This operation is specifically discussed below.

For the first readout operation, the communication/timing controller 20 sets the mode control signal CN5 to the low level so that each counter 254 is set to be in the down-count mode, and also sets a reset control signal CN6 to be active (the high level in this embodiment) for a predetermined period of time so that the count value of each counter 254 is reset to the initial value "0" (t8).

After a certain row is selected by the vertical scanner 14 performing row scanning and the first readout operation for reading the pixel signals from the selected row V$\alpha$ to the vertical signal lines 19 (H1, H2, . . . ) is stabilized, the communication/timing controller 20 supplies the control data CN4 (including offset OFF and slope $\beta$) for generating the reference signal RAMP to the reference signal generator 27.

At the same time, the communication/timing controller 20 supplies the active-low reset signal PSET to the voltage comparators 252 for a short period of time (t9). Accordingly, the potential of the input terminal of each voltage comparator 252 is set to a predetermined potential, and the operating point of each voltage comparator 252 is determined to be an appropriate level every time a row is selected.

In the reference signal generator 27 having received the control data CN4, the DAC circuit 27a generates the stepped waveform (RAMP waveform), which has the slope $\beta$ in accordance with color pixel characteristics of colors existing in the row V$\alpha$ and which changes in the shape of a saw tooth wave (RAMP) over time, and outputs the generated stepped waveform (RAMP waveform) as a comparison voltage to one input terminal RAMP of each voltage comparator 252 in the associated column AD circuit 25.

The voltage comparator 252 in each column compares the RAMP waveform comparison voltage with the pixel signal voltage of the vertical signal line 19 (H$\alpha$ ) in the associated column, which is supplied from the pixel portion 10.

Also, simultaneously with the input of the reference signal RAMP into the input terminal RAMP of each voltage comparator 252, the counter 254 disposed in each column measures the comparison time of the voltage comparator 252. Specifically, the count clock CK0 is input from the communication/timing controller 20 into the clock terminal of the counter 254 in synchronization with the ramp waveform voltage generated by the reference signal generator 27 (t10), and the counter 254 starts down-counting from the initial value "0", which serves as the first counting operation. That is, the counter 254 starts counting in the negative direction.

The voltage comparator 252 compares the ramp reference signal RAMP supplied from the reference signal generator 27 with the pixel signal voltage Vx input via the vertical signal line 19 and, when the two voltages become equal to each other, inverts the comparator output from the high level to the low level (t12). That is, the voltage comparator 252 compares the voltage signal corresponding to the reset component Vrst with the reference signal RAMP to generate an active-low (L) pulse signal after a time period corresponding to the level of the reset component Vrst has passed, and supplies the generated pulse signal to the counter 254.

Upon receiving this result, the counter 254 stops counting almost at the same time as the inversion of the comparator output, and latches (holds/stores) the count value at that time as pixel data, thereby completing AD conversion (t12). That is, the counter 254 starts down-counting simultaneously with the generation of the ramp reference signal RAMP supplied to the voltage comparator 252, and the counter 254 continues counting with the clock CK0 until receiving the active-low (L) pulse signal generated as a result of comparison, thereby obtaining the count value corresponding to the level of the reset component Vrst.

After a predetermined down-count period has passed (t14), the communication/timing controller 20 stops supplying the control data to the voltage comparator 252 and stops supplying the count clock CK0 to the counter 254. Then, the DAC circuit 27a stops generating the ramp reference signal RAMP.

In the first readout operation, counting is performed by detecting the reset level Vrst of each pixel signal voltage Vx using the voltage comparator 252. This corresponds to reading out the reset component $\Delta V$ of each unit pixel 3.

The reset component $\Delta V$ contains offset noise that varies from one unit pixel 3 to another. Generally, however, variations in the reset component $\Delta V$ are small, and the reset level Vrst is generally common to all the pixels. Accordingly, the output value of the reset component $\Delta V$ of each pixel signal voltage Vx of the arbitrary vertical signal line 19 is generally known.

Accordingly, when reading the reset component $\Delta V$ for the first time, the down-count period (t10 to t14; comparison period) is reduced by adjusting the variation characteristics of the RAMP voltage, thereby shortening the first comparison period. In this embodiment, comparison of the reset component $\Delta V$ is performed by setting the maximum period for performing comparison of the reset component $\Delta V$ to a 7-bit count period (128 clocks).

Subsequently, in the second readout operation, in addition to the reset component $\Delta V$, the electric signal component Vsig for each unit pixel 3 in accordance with the quantity of incident light is read, and an operation similar to the first readout operation is performed. More specifically, the communication/timing controller 20 first changes the mode control signal CN5 to the high level so that each counter 254 is set to be in the up-count mode (t18). After the second readout operation for reading the signal component Vsig from each unit pixel 3 of the selected row V$\alpha$ to the associated vertical signal line 19 (H1, H2, . . . ) is stabilized, the communication/timing controller 20 supplies the control data CN4 for generating the reference signal RAMP to the DAC circuit 27a in order to perform AD conversion of the signal component Vsig. At this time, unlike in the first readout operation, the communication/timing controller 20 does not change the reset signal PSET to the active low state.

In response to this, the DAC circuit 27a in the reference signal generator 27 generates the reference signal RAMP, which has the slope $\beta$ in accordance with the color pixel characteristics of colors existing in the row V$\alpha$ , which changes in the shape of a saw tooth (RAMP shape) over time, and which is less than the initial value Var for the reset component $\Delta V$ by the offset OFF, and supplies the generated reference signal RAMP as a comparison voltage to the input terminal RAMP of each voltage comparator 252 of the associated column AD circuit 25.

The voltage comparator 252 in each column compares the RAMP waveform comparison voltage with each pixel signal voltage of the vertical signal line 19 (Hα ) in the associated column, which is supplied from the pixel portion 10.

Simultaneously with the input of the reference signal RAMP into the input terminal RAMP of each voltage comparator 252, the counter 254 disposed in each column measures the comparison time of the voltage comparator 252. Specifically, the count clock CK0 is input from the communication/timing controller 20 into the clock terminal of the counter 254 in synchronization with the ramp waveform voltage generated by the reference signal generator 27 (t20), and, in contrast to the first readout operation, the counter 254 starts up-counting from the count value corresponding to the reset component ΔV of the unit pixel 3 obtained in the first readout operation, which serves as the second counting operation. That is, the counter 254 starts counting in the positive direction.

The voltage comparator 252 compares the ramp reference signal RAMP supplied from the reference signal generator 27 with the pixel signal voltage Vx input via the vertical signal line 19 and, when the two voltages become equal to each other, inverts the comparator output from the high level to the low level (t22). That is, the voltage comparator 252 compares the voltage signal corresponding to the signal component Vsig with the reference signal RAMP to generate an active-low (L) pulse signal after a time period corresponding to the level of the signal component Vsig has passed, and supplies the generated pulse signal to the counter 254.

Upon receiving this result, the counter 254 stops counting almost at the same time as the inversion of the comparator output, and latches (holds/stores) the count value at that time as pixel data, thereby completing AD conversion (t22). That is, the counter 254 starts up-counting simultaneously with the generation of the ramp reference signal RAMP supplied to the voltage comparator 252, and the counter 254 continues counting with the clock CK0 until receiving the active-low (L) pulse signal generated as a result of comparison, thereby obtaining the count value corresponding to the level of the signal component Vsig.

After a predetermined up-count period has passed (t24), the communication/timing controller 20 stops supplying the control data to the voltage comparator 252 and stops supplying the count clock CK0 to the counter 254. Then, the DAC circuit 27a stops generating the ramp reference signal RAMP.

In the second readout operation, counting is performed by detecting the signal component Vsig of each pixel signal voltage Vx using the voltage comparator 252. This corresponds to reading out the signal component Vsig of each unit pixel 3.

In this embodiment, the counter 254 performs counting in such a manner that the counter 254 performs down-counting in the first readout operation and up-counting in the second readout operation, and the counting results are held in the same storage place. Accordingly, the subtraction expressed by equation (1) is executed automatically in the counter 254, and the count value as a result of the subtraction is held in the counter 254: (Count value in the second comparison period)−(count value in the first comparison period)(1)

In this case, equation (1) can be modified into equation (2), and as a result, the count value held in the counter 254 is a value corresponding to the signal component Vsig. In order to perform high-resolution color imaging, a black reference is also taken into consideration so as to control the initial value and the gain for each color. In general (including monochrome imaging), the last term or the black reference may be ignored: (Count value in the second comparison period)−(count value in the first comparison period)=(signal component Vsig+reset component ΔV+offset component in the column AD circuit 25−(black reference component))−(reset component ΔV1+offset component in the column AD circuit 25)=(signal component Vsig)−(black reference component) (2)

That is, with the series of operations described above, the difference is calculated in the counter 254 performing counting in the two readout operations, i.e., down-counting in the first readout operation and up-counting in the second readout operation. Accordingly, the reset component ΔV varying from one unit pixel 3 to another and the offset component in each column AD circuit 25 can be eliminated. Only a digital signal can be extracted with a simple configuration by compensating the signal component Vsig in accordance with the quantity of incident light in each unit pixel 3 for the black reference component.

In this case, circuit variations and reset noise can also be advantageously eliminated. That is, the output value after the second readout operation represents a pure digital signal level from which the noise component has been eliminated. Accordingly, each column AD circuit 25 in this embodiment serves not only as an ADC for converting an analog pixel signal into digital pixel data, but also as a CDS function.

The pixel data represented by the count value calculated using equation (2) is a positive signal voltage. It thus becomes unnecessarily to perform the complementary operation, and the compatibility with existing systems is high.

In the second readout operation, the signal component Vsig in accordance with the quantity of incident light is read. In order to determine the quantity of light in a wide range, it is necessary to have a long up-count period (t20 to t24; comparison time) and to sharply change the ramp voltage to be supplied to each voltage comparator 252.

Accordingly, in this embodiment, comparison of the signal component Vsig is performed by setting the maximum period for performing comparison of the signal component Vsig to a 10-bit count period (1024 clocks). That is, the maximum period for performing comparison of the reset component ΔV (reference component) is set to be shorter than that for the signal component Vsig. Instead of setting the maximum period for comparison of the reset component ΔV (reference component), that is, the maximum value of the AD conversion period, to be the same as that for the signal component Vsig, the maximum period for comparison of the reset component ΔV (reference component) is set to be shorter than that for the signal component Vsig, thereby reducing the total AD conversion period of the two operations.

In this case, the number of comparison bits is different for the first operation and the second operation. The control data is supplied from the communication/timing controller 20 to the reference signal generator 27, and the ramp voltage is generated on the basis of the control data in the reference signal generator 27 so that the slope of the ramp voltage, i.e., the rate of change in the reference signal RAMP, becomes the same between the first operation and the second operation. It is easy to set the slope of the ramp voltage to be the same for the first operation and the second operation since the ramp voltage is generated by digital control. Accordingly, the precision of the AD conversion for the first operation can be equal to that for the second operation, thereby making it possible to obtain a correct subtraction result expressed by equation (1) using the up/down counter.

At a predetermined time (t28) after the completion of the second counting operation, the communication/timing controller 20 instructs the horizontal scanner 12 to read out the pixel data. In response to this instruction, the horizontal scanner 12 sequentially shifts the horizontal selection signal CH(i) to be supplied to the counters 254 via the control lines 12c.

With this operation, the count values expressed by equation (2) stored/held in the counters 254, i.e., the pixel data represented by the n-bit digital signal, are sequentially output to the outside the column processor 26 or the outside the chip having the pixel portion 10 from the output terminal 5c via the n horizontal signal lines 18. Subsequently, the operation is similarly repeated row by row, thereby obtaining image data D1 representing a two-dimensional image.

As has been described above, according to the solid-state imager, up/down-counters are used while the processing mode is switched so that the counting is performed twice. In the structure where the unit pixels 3 are arranged in a matrix, the column AD circuits 25 are disposed in the individual vertical columns in a column-parallel manner.

Regarding an ADC circuit including a comparator circuit and a counter, a DAC circuit, which is a function element for generating a reference signal for AD conversion to be supplied to the comparator circuit, is provided not for all the colors of color filters included in the color separation filter for use in color imaging, but for a combination of predetermined colors in accordance with a color repeating cycle determined by the types and arrangement of colors. When a row to be processed is changed, so does a combination of predetermined colors existing in that row to be processed. In response to this, the variation characteristics (specifically, the slope) and the initial value of the reference signal (analog reference voltage) generated by the DAC circuit are changed in accordance with the characteristics of the color filters, i.e., analog pixel signals.

Accordingly, the number of DAC circuits functioning as voltage generators and the number of lines from the reference voltage generators can be reduced to be less than the number of color filters included in the color separation filter. Multiplexers for selectively outputting the analog reference voltage (reference signal), which are necessary in the case where a reference voltage generator is provided for each color filter, become unnecessary. As a result, the circuit scale can be greatly reduced.

In addition, the variation characteristics (specifically, the slope) of the reference signal generated by each DAC circuit is changed when the combination of predetermined colors existing in a row to be processed is changed. Reference voltages that are different in accordance with the characteristics of color pixels included in the pixel portion 10 are individually generated, and comparison is performed. Therefore, in conversion of an analog pixel signal output from each unit pixel into a digital signal, the slope of a reference signal is adjusted in accordance with each color, thereby finely controlling the characteristics of each color.

In addition, the initial value of the reference signal generated by each DAC circuit is changed in accordance with the variation component inherent in the DAC circuit and the black reference component. Thus, the reference signal can be compensated for the circuit variation, and AD conversion of a signal generated by compensating for the black reference component can be performed using a simple configuration.

In addition, the result of subtraction between the reference component (reset component) and the signal component can be directly obtained for each vertical column as the result of the second counting operation. Accordingly, a memory device for holding the counting result for each of the reference component and the signal component can be implemented by a latch function included in the counter, and it is not necessary to provide, separately from the counter, a dedicated memory device for holding the AD converted data.

Additionally, a special subtractor for calculating the difference between the reference component and the signal component becomes unnecessary. Compared with a known configuration, the circuit scale and the circuit area can be reduced. Also, an increase in noise or an increase in current or power consumption can be prevented.

Since each column AD circuit (ADC) includes a comparator and a counter, regardless of the number of bits, counting can be controlled by one count clock for operating the counter and the control line for changing the count mode. Accordingly, a signal line for outputting the count value of the counter to the memory device, which was necessary in a known configuration, becomes unnecessary, thereby preventing an increase in noise or power consumption.

That is, in the solid-state imager 1 in which the ADCs are mounted on the same chip, the column AD circuits 25 serving as the ADCs each include a pair of the voltage comparator 252 and the counter 254. Also, the counter 254 performs counting operations including a combination of up-counting and down-counting, while the difference between a basic component (reset component in this embodiment) of a signal to be processed and a signal component is converted into a digital signal. Accordingly, the circuit scale, the circuit area, and the power consumption can be reduced. Additionally, the number of lines for interfacing with other functions can be reduced, and an increase in noise caused by the lines or current consumption of the lines can be prevented.

Although not shown in the drawing, a data storage device serving as an n-bit memory device for holding the counting results of the counter 254 may be provided subsequent to the counter 254. A control pulse is input to the data storage device from the horizontal scanner 12 via the control line 12c. The data storage device holds the count values obtained from the counter 254 until an instruction in terms of the control pulse is given via the control line 12c. In parallel with each voltage comparator 252 and each counter 254 included in the column processor 26 performing the corresponding functions, the horizontal scanner 12 has a function of a readout scanner for reading out the count values held by each storage device. With such a configuration, pipeline processing can be achieved.

In other words, before the operation of the counter 254 (t6), the counting result obtained by the processing on the previous row Hx−1 is transferred to the data storage device on the basis of a memory transfer instruction pulse CN8 from the communication/timing controller 20.

In the operation shown in FIG. 3, it is difficult to output the pixel data to the outside the column processor 26 prior to completion of the second readout operation, i.e., AD conversion, on the pixel signal to be processed. Thus, the readout operation is restricted. In contrast, when the data storage device is disposed subsequent to the counter 254, as in the operation shown in FIG. 4, the count value indicating the previous subtraction result can be transferred to the data storage device prior to the first readout operation (AD conversion) on the pixel signal to be processed. Thus, the readout operation is not restricted.

With such a configuration, the counting operation or AD conversion of the counter 254 and the readout operation involving reading the counting result to the horizontal signal line 18 can be independently controlled, thereby achieving the pipeline operation in which the AD conversion and the signal readout operation to an external source (at first, to the horizontal signal line 18) can be performed in an independent and parallel manner.

Detailed Example of Configuration of Voltage Comparator

Figure 5:
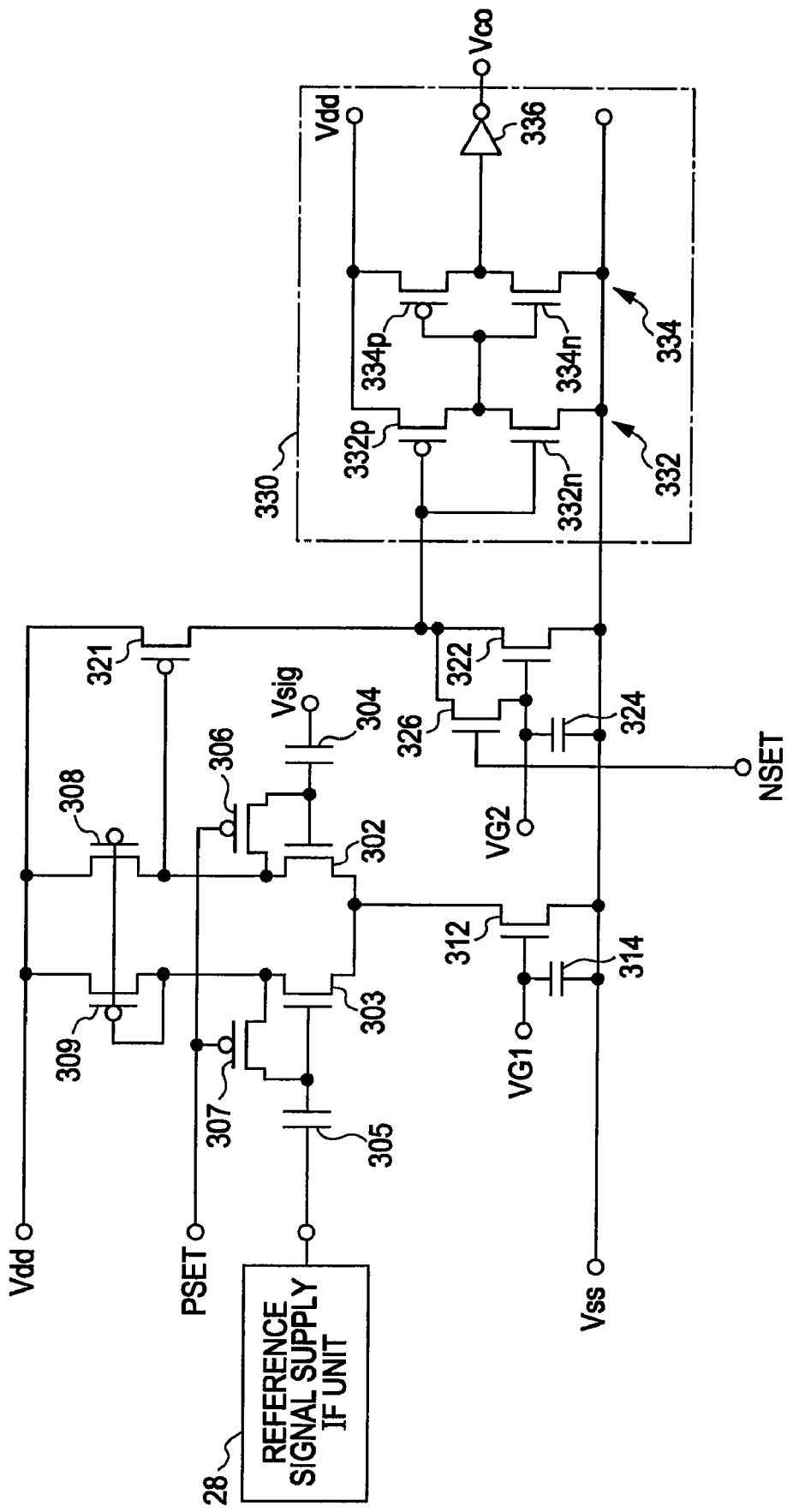
FIG. 5 is a diagram showing a detailed example of the configuration of a voltage comparator.

FIG. 5 shows a detailed example of the configuration of the voltage comparator 252. The voltage comparator 252 includes, at its input stage, differentially-connected NMOS transistors 302 and 303, coupling capacitors 304 and 305, and reset-switching PMOS transistors 306 and 307. The gate of the transistor 302 is connected to the vertical signal line 19 via the coupling capacitor 304, the gate of the transistor 303 is connected to the output of the reference signal supply IF unit 28 via the coupling capacitor 305. In particular, the gates of a differential pair of the transistors 302 and 303 are referred to as "differential input gates".

The source and drain of the transistor 306 are connected between the gate and drain of the transistor 302. The source and drain of the transistor 307 are connected between the gate and drain of the transistor 303. The active-low reset signal PSET is applied from the communication/timing controller 20 to the gates of the transistors 306 and 307.

The voltage comparator 252 further includes, at the drain side of the transistors 302 and 303, PMOS transistors 308 and 309 as a load circuit. Specifically, the sources of the transistors 308 and 309 are connected to the power supply Vdd, and the gates of the transistors 308 and 309 are connected with each other, thereby forming a current mirror circuit. The drain of the transistor 309 is connected to the gate of the transistor 309 and to the drain of the transistor 303, and the drain of the transistor 308 is connected to the drain of the transistor 302.

The voltage comparator 252 further includes, at the source side of the transistors 302 and 303, an NMOS transistor (particularly referred to as a "load MOS transistor") 312 for defining the operating current of the transistors 302 and 303. The drain of the load MOS transistor 312 is commonly connected to the sources of the transistors 302 and 303, and the source of the load MOS transistor 312 is grounded. A capacitor 314 is connected between the gate of the load MOS transistor 312 and the ground. A DC gate voltage VG1 for defining the operating current is supplied from the communication/timing controller 20 to the gate of the load MOS transistor 312. Since the DC gate voltage VG1 is applied to the gate of the load MOS transistor 312, the load MOS transistor 312 operates as a constant current source.

The transistors 302, 303, 308, 309, and 312 together form a differential amplifier.

In the voltage comparator 252, the gate of a transistor 321 is connected to the output end of the differential amplifier, i.e., the drain of the transistor 308. The source of the transistor 321 is connected to the power supply Vdd, and the drain of the transistor 321 is grounded via an NMOS transistor (particularly referred to as a "load MOS transistor") 322. The drain of the load MOS transistor 322 is connected to the drain of the transistor 321, and the source of the load MOS transistor 322 is grounded. A capacitor 324 is connected between the gate of the load MOS transistor 322 and the ground. A DC gate voltage VG2 for defining the operating current is supplied from the communication/timing controller 20 to the gate of the load MOS transistor 322. Since the DC gate voltage VG2 is supplied to the gate of the load MOS transistor 322, the load MOS transistor 322 operates as a constant current source.

In the voltage comparator 252, the source and drain of a reset-switching NMOS transistor 326 are connected between the gate and drain of the transistor 322. The active-high reset signal NSET is applied from the communication/timing controller 20 to the gate of the transistor 326.

The output of the differential amplifier from the drains of the transistors 321 and 322 becomes a comparator output Vco via an inversion-output buffer amplifier 330 and is supplied to the next counter 254. The buffer amplifier 330 includes a previous-stage CMOS inverter 332 connected in series between the power supply Vdd and the ground and including a PMOS transistor 332p and an NMOS transistor 332n whose gates and drains are commonly connected, a subsequent-stage CMOS inverter 334 connected in series between the power supply Vdd and the ground and including a PMOS transistor 334p and an NMOS transistor 334n whose gates and drains are commonly connected, and a general CMOS inverter 336. The configuration of the buffer amplifier 330 is only an example, and the buffer amplifier 330 may include, for example, only the previous-stage CMOS inverter 332.

Reference Signal Supply IF Unit (First Embodiment)

Figure 6:
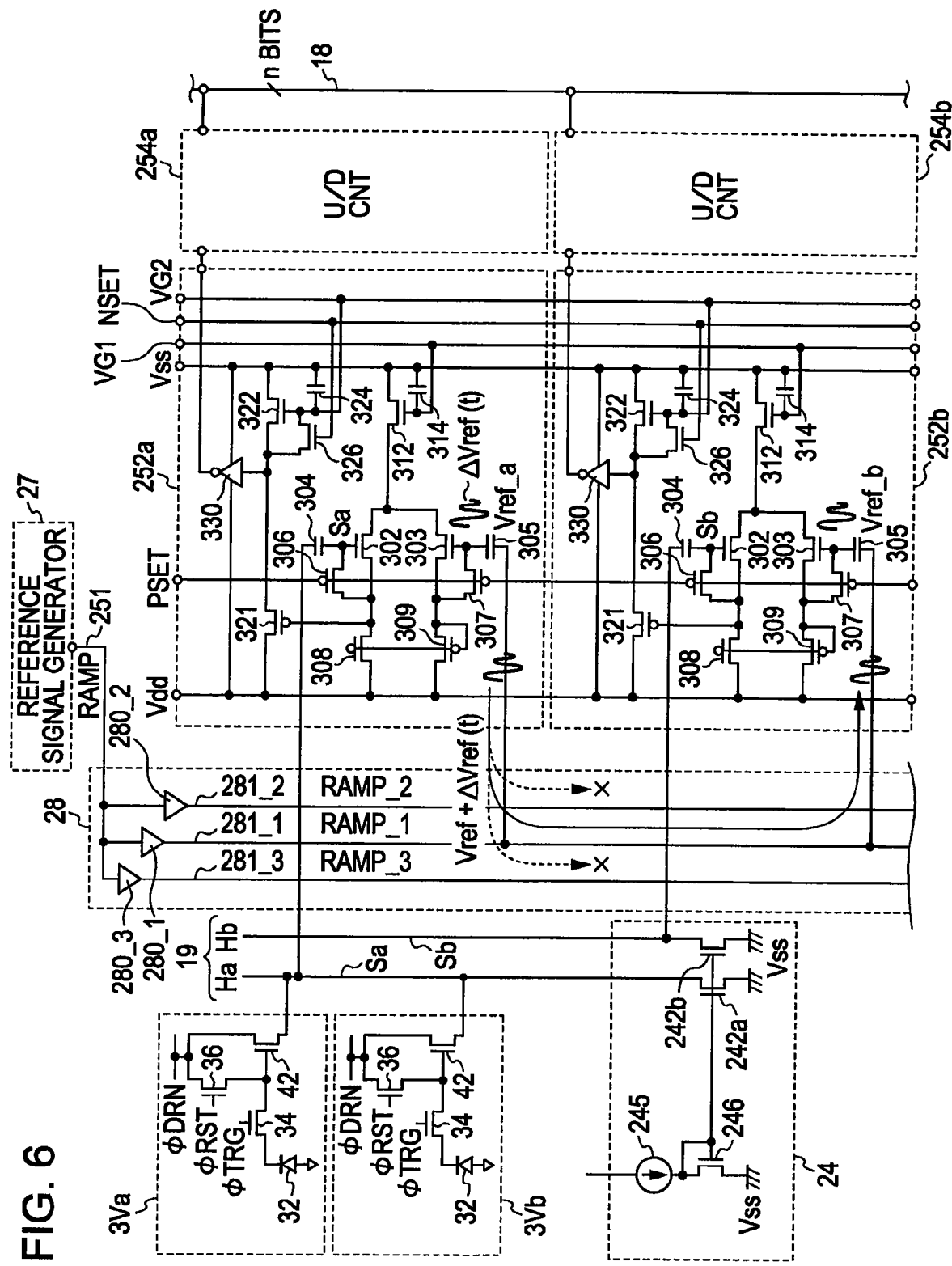
FIG. 6 is a diagram (part 1) showing a reference signal supply interface (IF) unit according to the first embodiment.
Figure 7:
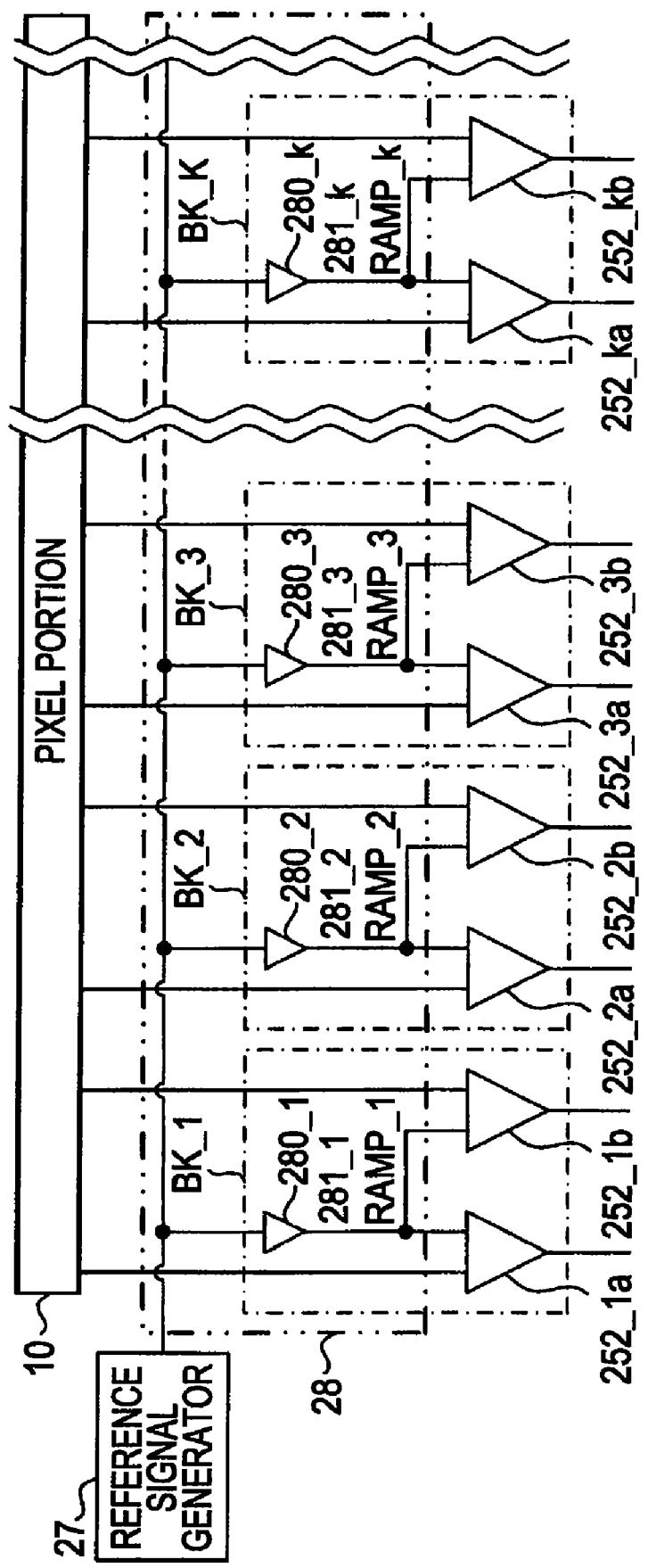
FIG. 7 is a diagram (part 2) showing the reference signal supply IF unit according to the first embodiment.

FIGS. 6 and 7 show the reference signal supply IF unit 28 according to the first embodiment of the present invention. In particular, the signal transmission (interface) among the unit pixels 3, the reference signal generator 27, and the voltage comparators 252 included in the column AD circuits 25 will be examined.

Figure 8:
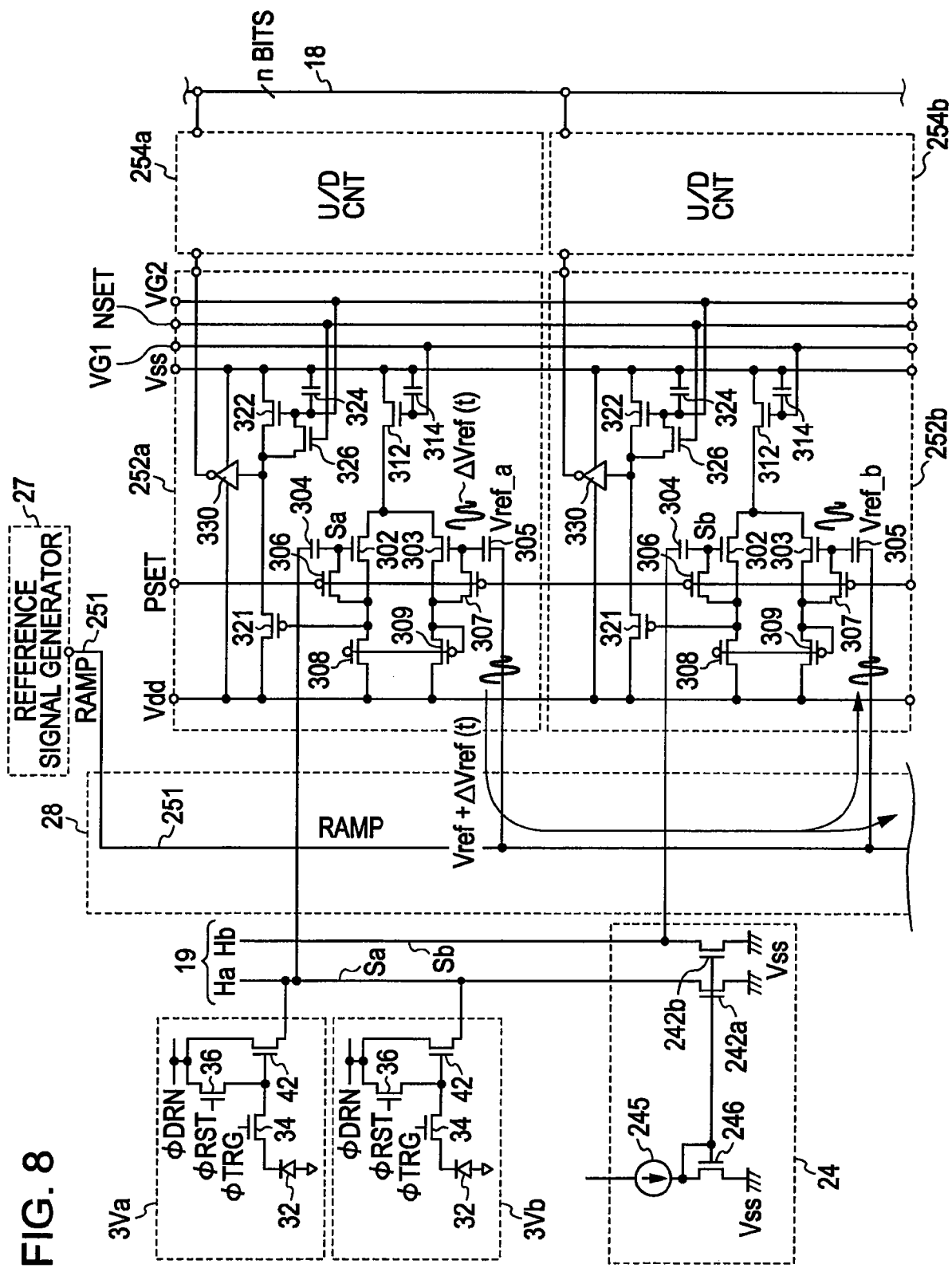
FIG. 8 is a diagram showing a known reference signal supply IF unit.

FIG. 6 shows the basic configuration of an interface for use in the first embodiment. FIG. 7 shows the overall outline of the interface. FIG. 8 shows, as a comparison example, the basic configuration of a known interface. Unit pixels 3Va and 3Vb in two rows of a certain column Ha and voltage comparators 252a and 252b in two rows have the above-described detailed circuit configurations. The unit pixels 3Va and 3Vb have a 3TR structure shown in FIG. 2B.

First, pixel signals of the unit pixels 3Va and 3Vb are transferred to the vertical signal line 19 in the column Ha. The pixel signal Sa is input to the pixel signal input stage of the voltage comparator 252a (gate at the side of the capacitor 304). The pixel signal Sb transferred to the vertical signal line 19 in the column Hb is input to the pixel signal input stage of the voltage comparator 252b (gate at the side of the capacitor 304).

As shown in FIGS. 6 and 7, the reference signal supply IF unit 28 of the first embodiment includes, on the reference signal line 251, a buffer circuit (buffer amplifier) 280 for supplying a reference signal output from the reference signal generator 27 to each voltage generator 252.

In particular in the first embodiment, the reference signal supply IF unit 28 includes a plurality of buffer circuits 280, and one buffer circuit 280 is assigned to the plural voltage comparators 252 included in one block BK. The voltage comparators in all the columns are divided into a plurality of blocks BK_k (k is an arbitrary integer), each block including a plurality of voltage comparators 252 (needless to say, the number of which is less than the total number of columns), and one buffer circuit 280 is provided for each block.

In the example shown in FIG. 6, one buffer circuit 280_k is provided for two voltage comparators 252a and 252b. A reference signal RAMP_1 output from a buffer circuit 280_1 is commonly transferred to each reference signal input stage of the voltage comparators 252a and 252b (gate at the side of the capacitor 305) via a reference signal output line 281_1. The reference signal RAMP_1 is input as a reference signal Vref_a to the voltage comparator 252a and as a reference signal Vref_b to the voltage comparator 252b. Each reference signal output line 281_k may be stopped at a necessary point. Alternatively, each reference signal output line 281_k may be of the same length, as indicated by dotted lines in FIG. 6, in order to have the same amount of signal delay in each column.

Although not shown in FIG. 6, as shown in FIG. 7, the overall outline is such that a reference signal RAMP_k output from another buffer circuit 280_k is commonly input to each reference signal input stage of the voltage comparators 252 (gate at the side of the capacitor 305) in another plurality of columns (two columns a and b in this example) via the reference signal output line 281_k.

This is only an example, and it is only necessary for the reference signal supply IF unit 28 to have a configuration in which the reference signal input stages of the voltage comparators 252 in all the columns are divided into a plurality of blocks. It is only necessary for the reference signal supply IF unit 28 to have at least two buffer circuits 280, to each of which a plurality of voltage comparators are connected. As in a third embodiment described subsequently, one buffer circuit 280 may be provided for each column, that is, one buffer circuit 280 may be assigned to the voltage comparators 252 in each column. In contrast, the configuration in which only one buffer circuit 280 is provided and the voltage comparators 252 in all the columns are connected to this buffer circuit 280 is practically the same as that shown in FIG. 8, and the reference signal input stages of the voltage comparators 252 are not divided into a plurality of blocks. Thus, this configuration is not included in the embodiments of the present invention.

The buffer circuits 280 each have a function of a buffer amplifying circuit for converting an output impedance of the reference signal generator 27 (to be precise, the DAC circuit 27a) into a low-output impedance and separating the input from the output. The buffer circuits 280 each supply a reference signal to the coupling capacitor 305 disposed at one input end of the transistors 302 and 303 (gate of the transistor 303) forming the differential pair of the voltage comparator 252. The buffer circuits 280 are described in detail later.

Figure 9:
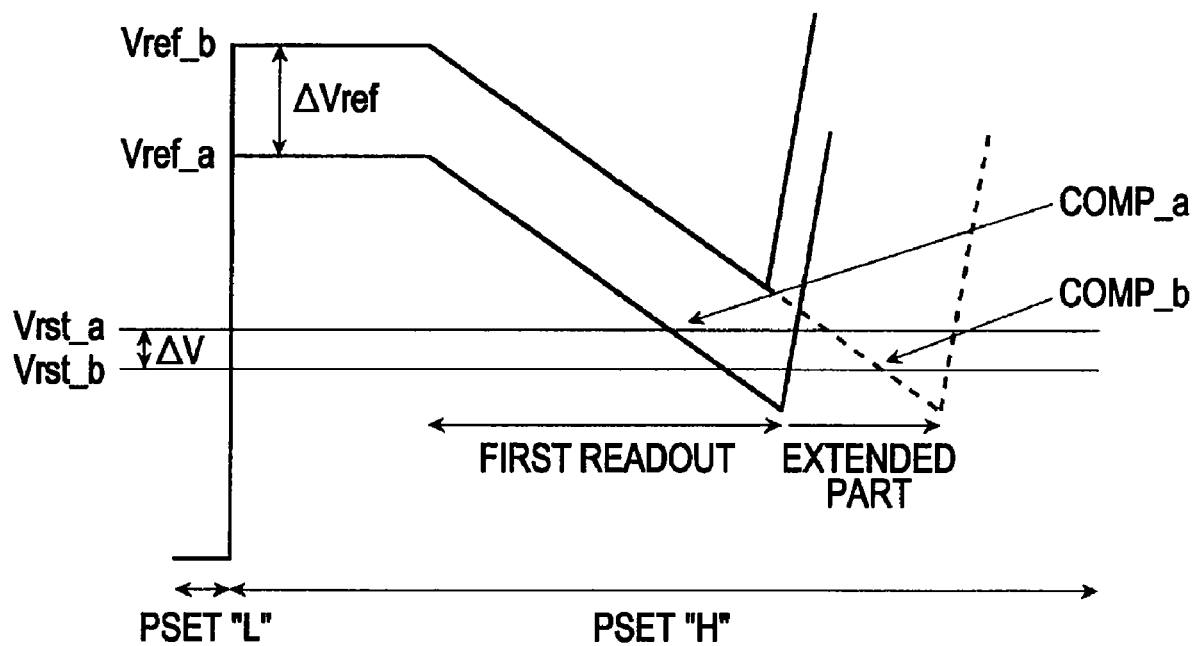
FIG. 9 is a diagram illustrating the details of a problem of the known reference signal supply IF unit.

In contrast, in a known reference signal supply IF unit 28 shown in FIG. 8, a reference signal RAMP output from a DAC circuit 27a included in a reference signal generator 27 is transferred to voltage comparators 252 via a reference signal line 251. The voltage comparators 252 in all the columns are connected to the reference signal line 251. That is, the reference signal RAMP is commonly supplied to the reference signal input stage of the voltage comparator 252 in a certain column and to the reference signal input stages of the other voltage comparators 252. Details of Problem of Known Reference Signal Supply IF Unit FIG. 9 illustrates the details of a problem of the known reference signal supply IF unit 28. In the column processor 26 (particularly the column AD circuits 25) shown in FIG. 1, high-speed imaging can be achieved by reducing the counting time of the reset potential and of the signal potential as short as possible.

In the case of the known reference signal supply IF unit 28 shown in FIG. 8, it takes time to read the count value from the counter. This may be caused by the following. Specifically, various signal lines for driving a plurality of voltage comparators 252 are connected to the common wiring, and noise generated in a voltage comparator is transferred to the other voltage comparators via the common wiring, thereby influencing the operation of the other voltage comparators.

For example, as is clear from the configuration shown in FIG. 8, there is one voltage comparator 252 in each vertical column. The power supply voltage (Vdd), the ground potential (Vss), the reference signal line 251 for the reference signal RAMP, a reset control line 331 for the PSET signal (particularly referred to as a "PSET control line 331"), and a reset control line 332 for the NSET signal (particularly referred to as an "NSET control line 332") are connected to the common wiring. Therefore, noise generated in the voltage comparator 252 in a certain column may influence the operation of the other voltage comparators 252 through the common wiring.

In particular, the transistors 306 and 307 serving as a switch for setting the operating point of comparison are provided in each input stage to which an analog signal to be processed and the reference signal are input. Since the switch is controlled by the common reset signal, noise transmitted through the reset signal PSET has a large influence on voltage variations of the reference signal RAMP.

Noise transmitted through the reset signal PSET includes feed through or charge injection of the PSET transistors 307 and 308, which occurs when the reset signal PSET becomes inactive (turned off), or fixed-point variation determined by kTC noise. For example, FIG. 8 shows the reference signal RAMP and the potential of the differential input gate immediately after the reset signal PSET has been turned off in abnormal operation. As shown in FIG. 8, due to noise transmitted through the PSET control line 331, the potential of the reference signal RAMP is not Vref, but is Vref+$\Delta$Vref(t), i.e., the potential of the reference signal RAMP has a noise component of $\Delta$Vref(t) in the temporal direction.

Since the reset signal PSET has a delay due to the position dependence and the performance of the switch, the PSET transistors 306 and 307 in each vertical column are turned off at different times. Therefore, the noise component $\Delta$Vref(t) generated in the voltage comparator 252a when the reset signal PSET has been turned off reaches, via the reference signal line 251, the reference signal input stage of the voltage comparator 252b (gate of the transistor 303) whose reset signal PSET has not been turned off yet, and the reset potential Vref_b of the transistor 303 may be changed.

As shown in FIG. 9, this phenomenon appears in the form of the differential input gate terminal potential variation $\Delta$Vref in each column upon resetting. In order to prevent the variations in all the columns to have an adverse influence on AD conversion, it is necessary to have a long time for the first readout operation.

Specifically, in the description of the first readout operation (of the reset component in each pixel signal) using FIG. 3, the variation of the reset component $\Delta$V is generally small, and the reset level Vrst is generally common in all the pixels. Thus, the output value of the reset component $\Delta$V of the pixel signal voltage Vx of the arbitrary vertical signal line 19 is roughly known in advance. In the first readout operation of the reset component $\Delta$V, the down-count period (t10 to t14; comparison time) can be shortened by adjusting the RAMP voltage.

However, when the reference signal RAMP has a potential variation (noise component $\Delta$Vref), it is necessary to have a time allowance for the voltage comparators 252 in all the columns to complete comparison. Thus, the first comparison time becomes longer.

For example, FIG. 9 shows the case in which $\Delta$V indicates variations in the reset level of a pixel signal (Vrst_a>Vrst_b). In this case, whereas the reference signal Vref_a in the column Ha reaches a comparison point COMP_a of the reset level Vrst_a, the reference signal Vref_b in the column Hb does not reach a comparison point COMP_b of the reset level Vrst_b. In order to prevent this, it is necessary to extend the comparison time so that the reference signal Vref_b in the column Hb reaches the comparison point COMP_b. For example, the first AD conversion is not completed in a 7-bit count period (128 clocks). It is necessary to add, for example, one bit to the count period. Thus, it takes a longer time to perform the first readout operation.

In the known reference signal supply IF unit 28 in which the reference signal generator 27 is directly interfaced with the voltage comparators 252 via the reference signal line 251, it takes time to read out the count value particularly for the first time. This is because, as is clear from the above description, the reference signal RAMP generated in the reference signal generator 27 is supplied via the single reference signal line 251 to the reference signal input stages of the voltage comparators 252 in all the vertical columns.

In order to solve this problem, for example, the configuration in which the reference signal input stage of the voltage comparator 252 in a certain vertical column is separated from that of the voltage comparator 252 in another vertical column (hereinafter the configuration may also be referred to as a "reference-signal-input-stage-separated configuration) may be effective. Accordingly, if the noise component ΔVref is generated in the reference signal input stage of the voltage comparator 252 in a vertical column, this noise component ΔVref is not transmitted to the reference signal input stage of the separated voltage comparator 252. Hereinafter, the reference signal supply IF unit 28 having such a reference-signal-input-stage-separated configuration will be described in detail.

Buffer Circuit (First Embodiment)

Figure 10:
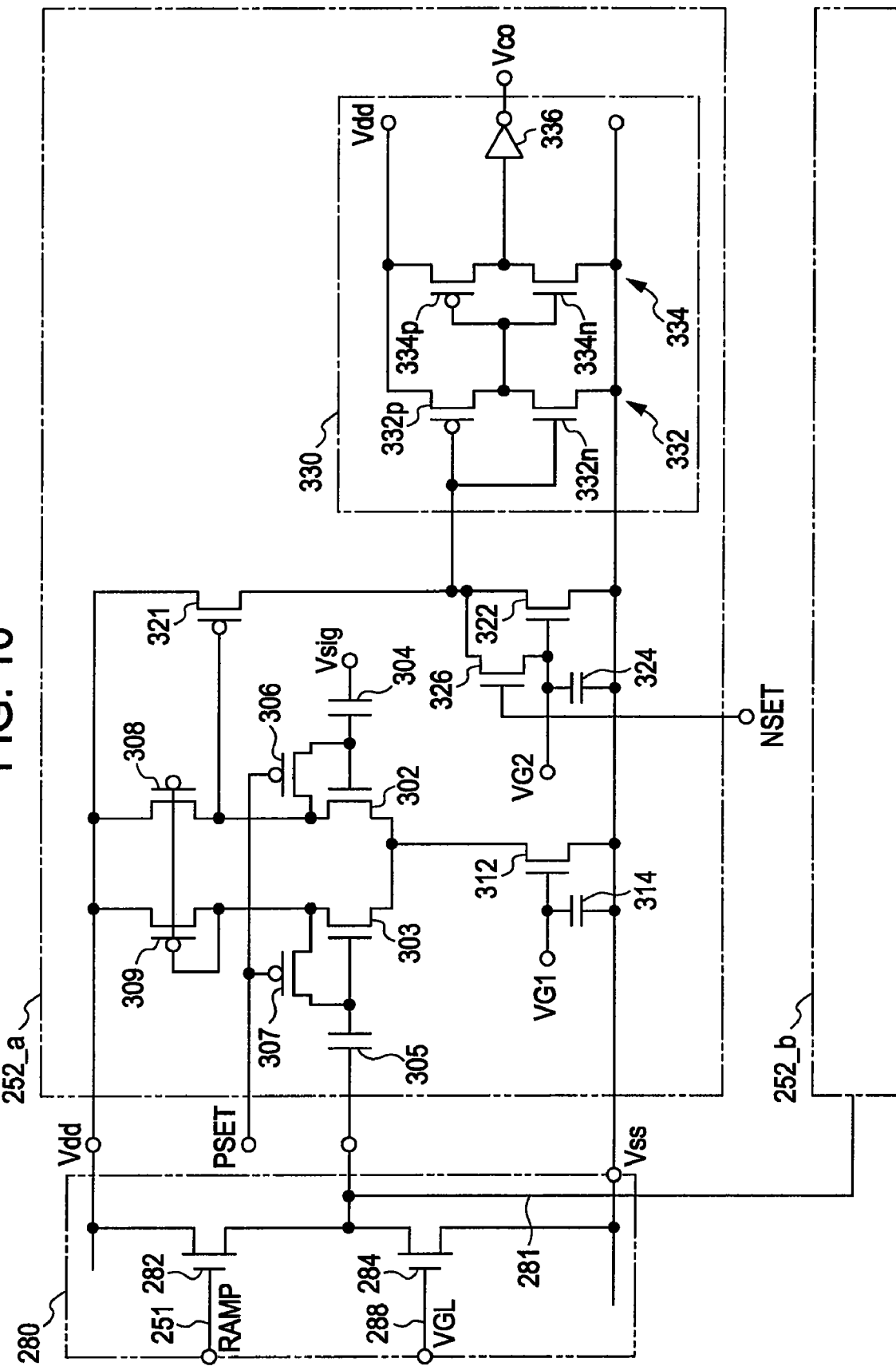
FIG. 10 is a diagram showing, together with a detailed example of the configuration of the voltage comparator, a detailed example of the configuration of a buffer circuit according to the first embodiment.
Figure 11:
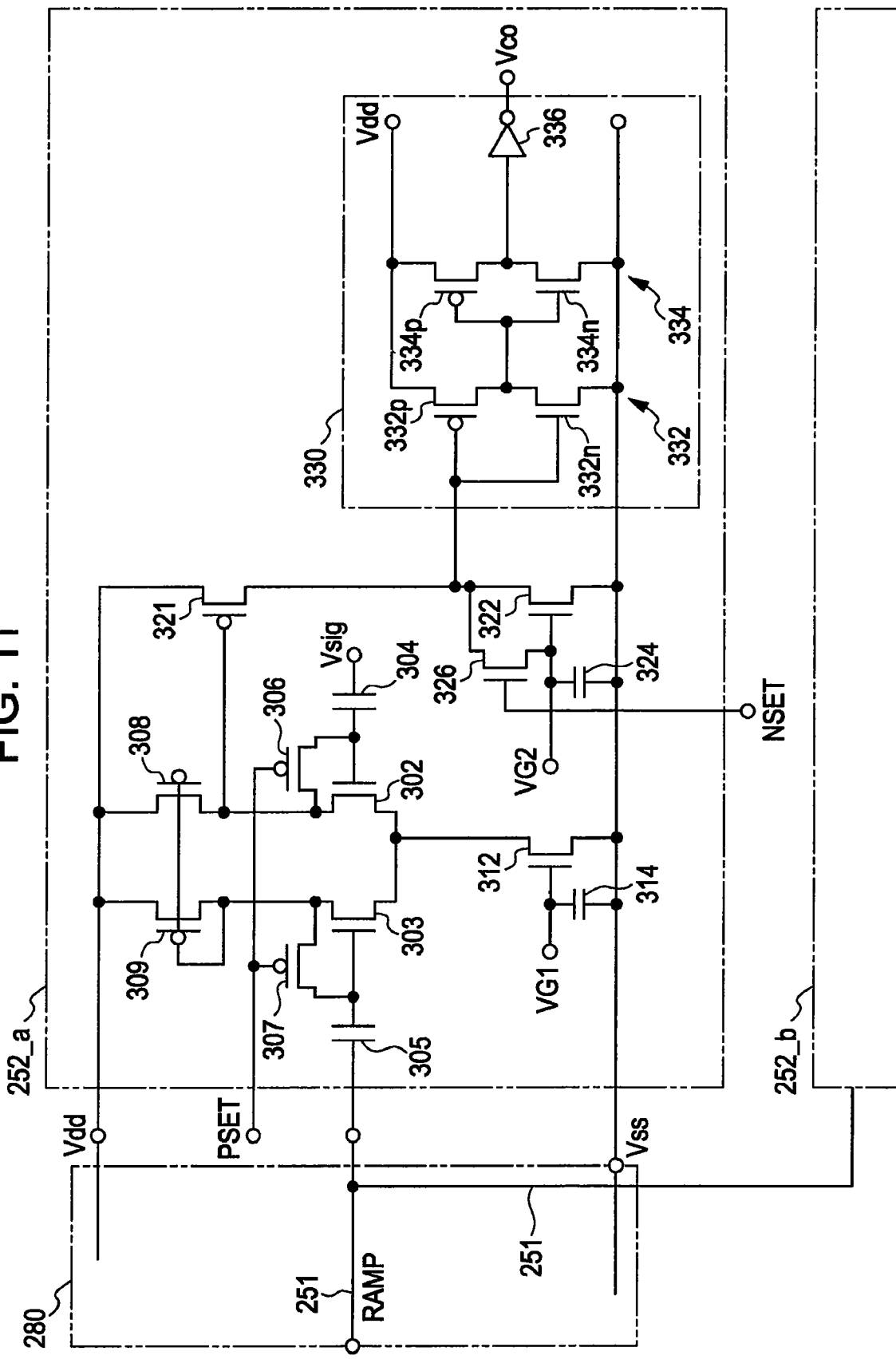
FIG. 11 is a diagram showing, together with a detailed example of the configuration of the voltage comparator, a detailed example of the configuration of a known buffer circuit serving as a comparison example.

FIG. 10 is a diagram showing, together with a detailed example of the configuration of the voltage comparator 252, a detailed example of the configuration of the buffer circuit 280 according to the first embodiment. FIG. 11 is a diagram showing, together with a detailed example of the configuration of the voltage comparator 252, a detailed example of the configuration of a known buffer circuit 280 serving as a comparison example.

The buffer circuit 280 is a source follower circuit. Specifically, the buffer circuit 280 includes an NMOS transistor (referred to as an "amplifying transistor") 282, which is connected at its drain to the power supply Vdd and which receives at its gate the reference signal RAMP via the reference signal line 251, and an NMOS transistor (referred to as a "load MOS transistor") 284, which is connected between the source of the amplifying transistor 282 and the ground and which supplies the operating current to the amplifying transistor 282.

The source of the amplifying transistor 282 is connected to the input side of a coupling capacitor 305 disposed at the gate of the transistor 303, which is one of the differential pair of the voltage comparator 252. The DC gate voltage VGL for defining the operating current is supplied to the gate of the load MOS transistor 284 from the communication/timing controller 20 via the a bias control line 288.

With the reference-signal-input-stage-separated configuration in which the reference signal input stages are separated into a plurality of blocks using the buffer circuits 280, the reference signal line 251 and the reference signal output lines 281 of the associated blocks are separated using the buffer circuits 280. Variations in the output potential of the buffer circuit 280, which may occur in the reference signal output lines 281, only have a negligible influence on the input potential (that is, the reference signal line 251). If the noise component ΔVref is generated in the reference signal input stage of the voltage comparator 252 in a certain block, this noise component ΔVref is not transmitted to the reference signal input stage of the voltage comparator 252 in another separated block.

As indicated by dotted lines and "X" at the tip of each arrow in FIG. 6, the problem of the known reference signal supply IF unit 28 can be alleviated. That is, it becomes less possible for noise in the voltage comparator 252 in a certain column, which is generated when the PSET signal is turned off, to vary, via the reference signal line 251, the comparison points (particularly referred to as the "reset points") in the first comparison (AD conversion of the reset potential in this embodiment) using the voltage comparators 252 included in the other blocks. Suppression of variations in the reset potential contributes to reduction of count time of the reset potential in a pixel signal, i.e., AD conversion time of the reset potential, thereby achieving high-speed imaging.

In the above paragraph, it has been stated that "it becomes less possible" because, as indicated by solid lines in FIG. 6, it is very difficult to prevent, within the same block, noise generated in the voltage comparator 252 in a certain column when the PSET signal is turned off from varying, via the reference signal output lines 281, the comparison points of the voltage comparators 252 in the other columns. This problem can be alleviated by reducing the number of voltage comparators 252 in one block, that is, the number of voltage comparators 252 covered by one buffer 280, as much as possible. This point is taken into consideration in the reference signal supply IF unit 28 according to the second embodiment described later.

It is preferable that, in order to ensure linearity of the differential input end of the voltage comparator 252, the transistors 282 and 284 included in the buffer circuit 280 have the following configuration. Specifically, it is preferable that the output stage of each pixel signal generator 5 in the pixel portion 10, that is, the source follower circuit including the amplifying transistor 42 and the load MOS transistor 242 in each pixel signal generator 5, and the source follower circuit including the amplifying transistor 282 and the load MOS transistor 284 in each voltage comparator 252 have the same configuration and substantially the same transistor characteristics. In view of this point, it is convenient when the column processor 26 including the voltage comparators 252 and the reference signal supply IF unit 28 are integrated on the same chip as the pixel portion 10.

More specifically, when the amplifying transistor 282 and the load MOS transistor 284 have the same oxide layer thickness and the threshold voltage as those of the amplifying transistor 42 and the load MOS transistor 242, they have the same transistor characteristics. With regard to the size, it is preferable that the amplifying transistor 282 be of size equivalent to that of the amplifying transistor 42 in the source follower circuit for use in the pixel signal generator 5, and similarly it is preferable that the load MOS transistor 284 be of size equivalent to that of the load MOS transistor 242. This is advantageous in equalizing the linearity at both input gates of the voltage comparator 252.

It is not necessary, in a narrow sense, for each transistor included in the source follower circuit of the buffer circuit 280 to be of size equivalent to that of each transistor in the pixel signal generator 5. It is only necessary for the transistors to have practically the same characteristics by making the corresponding transistors have the same gate length/gate length ratio (so-called size ratio). When transistors having a plurality of threshold voltages are used in a CMOS image sensor, it is preferable that the corresponding transistors described above have the same threshold voltage.

In order to allow the reference signal RAMP generated in the reference signal generator 27 to accurately pass through the source-follower buffer circuit 280, it is preferable that the frequency band of the source-follower buffer circuit 280 be equivalent or wider than that of the voltage comparator 252.

Buffer Circuit (Second Embodiment)

Figure 12:
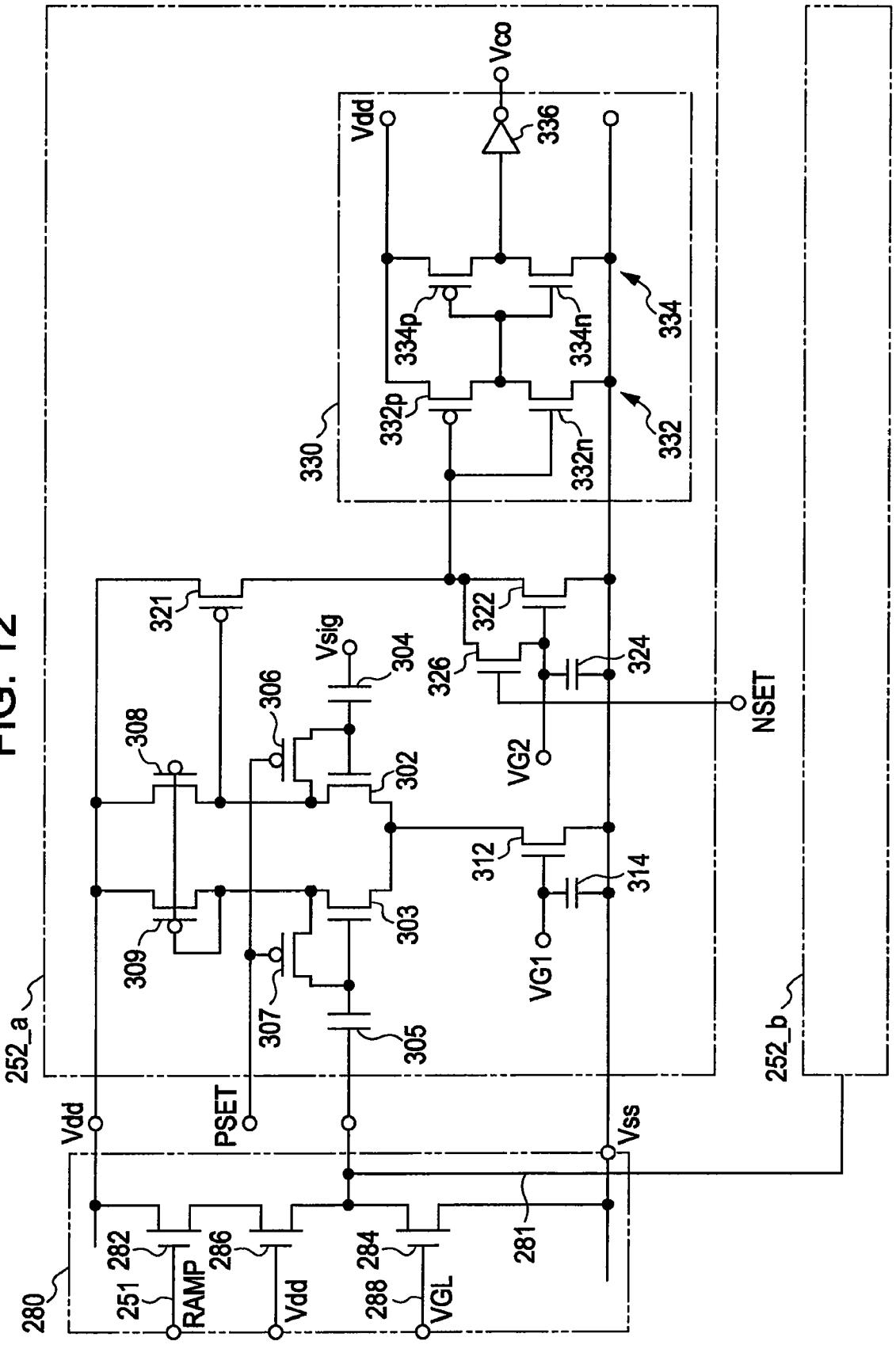
FIG. 12 is a diagram (part 1) showing, together with a detailed example of the configuration of the voltage comparator, a detailed example of the configuration of the buffer circuit according to a second embodiment of the present invention.
Figure 13:
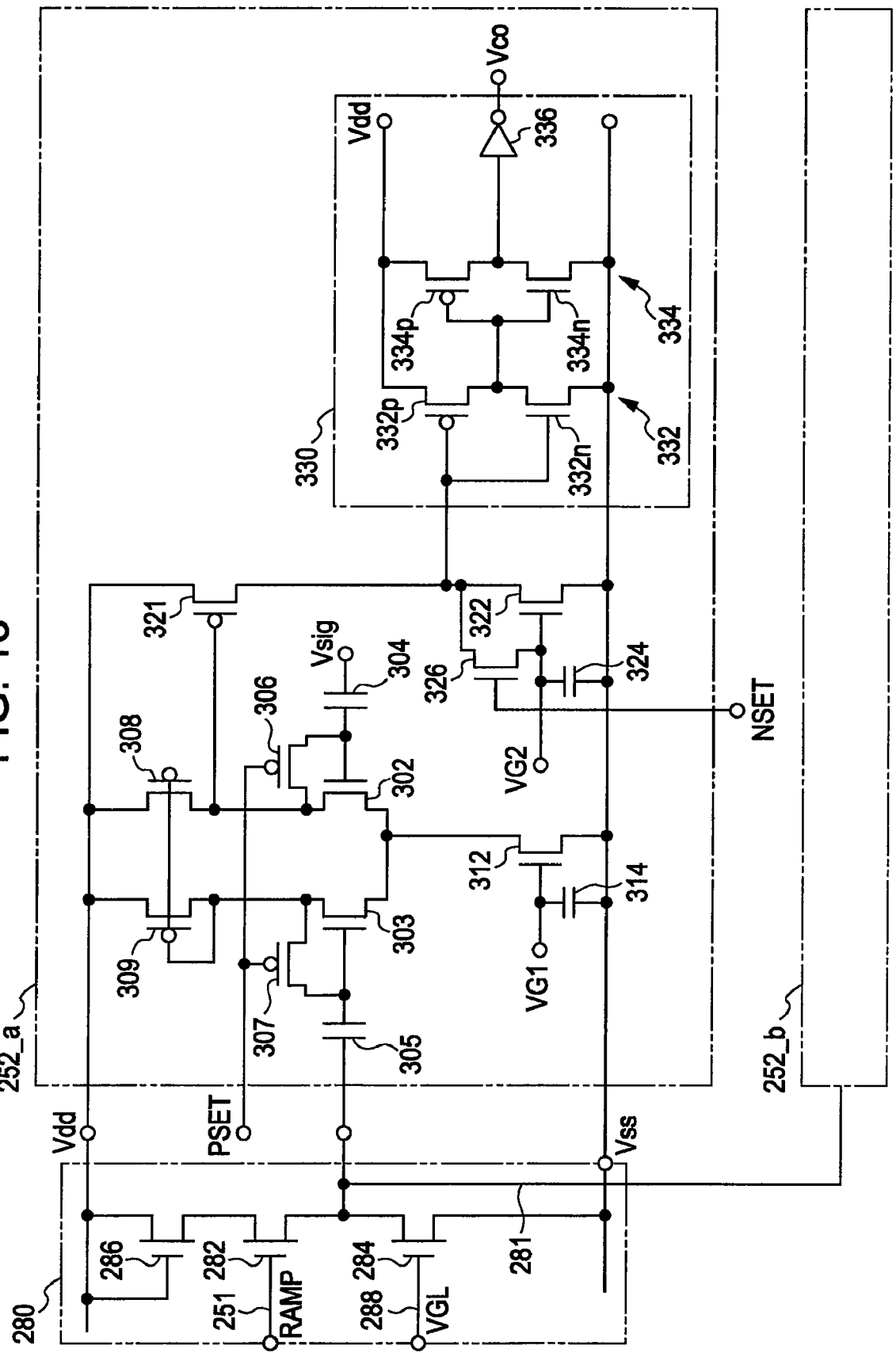
FIG. 13 is a diagram (part 2) showing, together with a detailed example of the configuration of the voltage comparator, a detailed example of the configuration of the buffer circuit according to the second embodiment.

FIGS. 12 and 13 are diagrams showing, together with a detailed example of the configuration of the voltage comparator 252, a detailed example of the configuration of the buffer circuit 280 according to the second embodiment of the present invention. The buffer circuit 280 according to the second embodiment copes with the case in which each unit pixel 3 has a 4TR structure shown in FIG. 2A.

As has been described in the first embodiment, in order to ensure linearity of the differential input terminal of the voltage comparator 252, the source follower of the buffer circuit 280 preferably has the same configuration as that in the pixel portion 10, or each transistor in the source follower of the buffer circuit 280 has the same size as that in the pixel portion 10.

In order to cope with the unit pixel 3 with a 4TR structure shown in FIG. 2A, as shown in FIG. 12, it is preferable that an NMOS transistor 286 of the same size and characteristics as those of the vertical selection transistor 40 be disposed between the source of the amplifying transistor 282 and the drain of the load MOS transistor 284. The transistor 286 is connected at its drain to the source of the amplifying transistor 282, at its source to the drain of the load MOS transistor 284, and at its gate to the power supply Vdd.

In the pixel signal generator 5, when the vertical selection transistor 40 is connected at its drain to the power supply Vdd and at its source to the drain of the amplifying transistor 42 and the vertical selection gate SELV is connected to the vertical selection line 52, in order to have the same source follower configuration, as shown in FIG. 13, it is preferable that the NMOS transistor 286 of the same size and characteristics as those of the vertical selection transistor 40 be disposed between the drain of the amplifying transistor 282 and the power supply Vdd. The transistor 286 is connected at its drain to the power supply Vdd, at its source to the drain of the amplifying transistor 282, and at its gate to the power supply Vdd.

Reference Signal Supply IF Unit (Second Embodiment)

Figure 14:
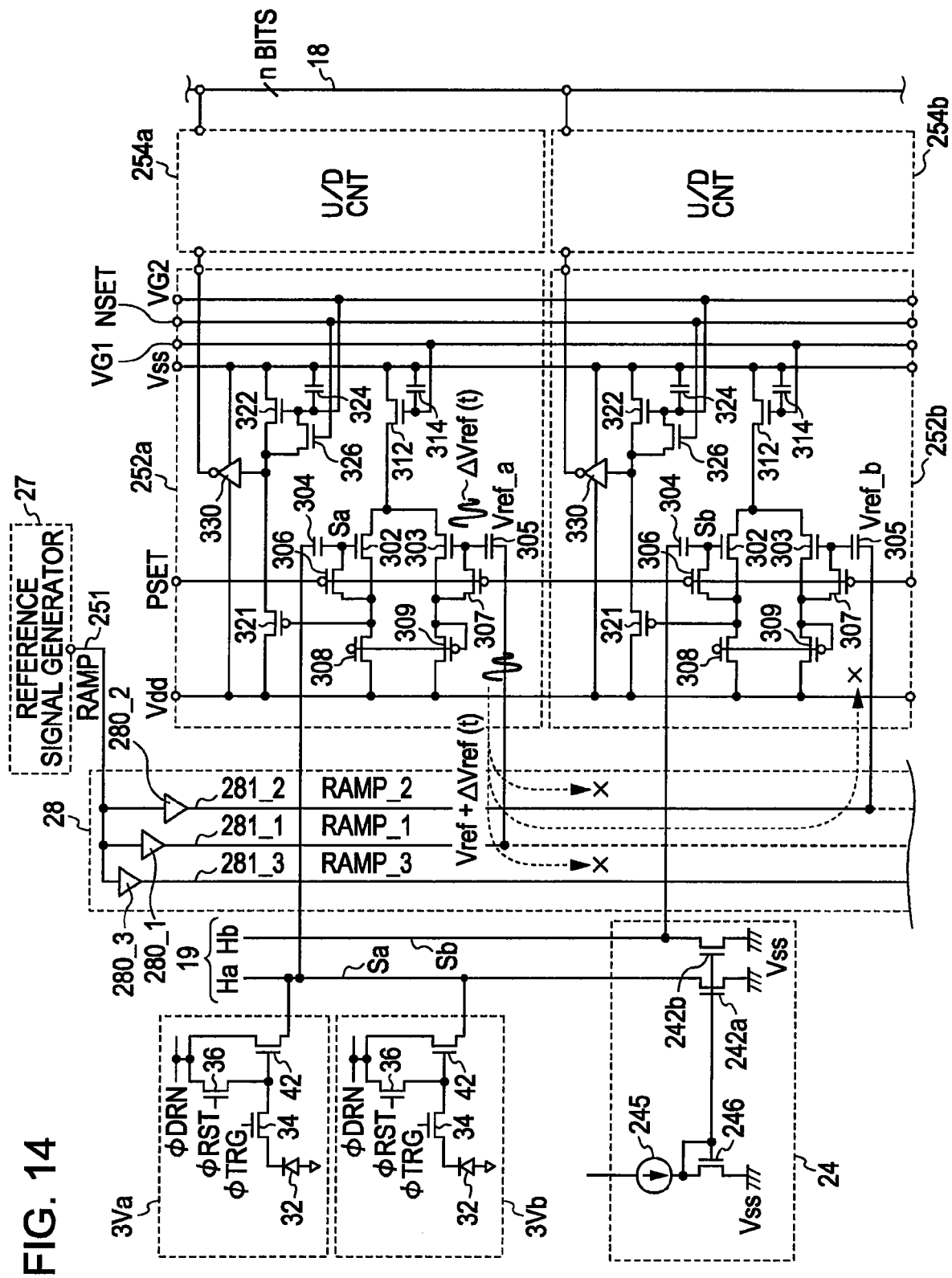
FIG. 14 is a diagram (part 1) showing the reference signal supply IF unit according to the second embodiment.
Figure 15:
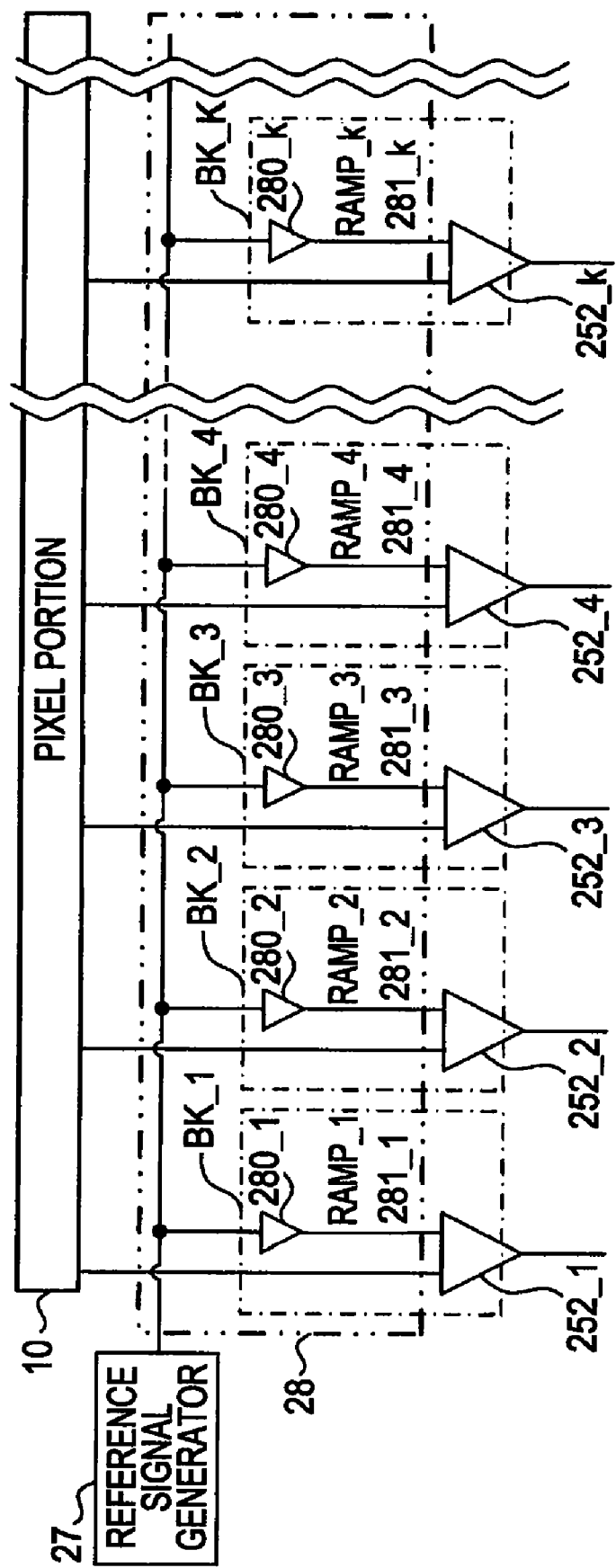
FIG. 15 is a diagram (part 2) showing the reference signal supply IF unit according to the second embodiment.

FIGS. 14 and 15 are diagrams showing the reference signal supply IF unit 28 according to the second embodiment. In particular, the signal transmission (interface) among the unit pixels 3, the reference signal generator 27, and the voltage comparators 252 included in the column AD circuits 25 will be examined. FIG. 14 shows the basic configuration of an interface for use in the second embodiment. FIG. 15 shows the overall outline of the interface.

In the reference signal supply IF unit 28 according to the first embodiment, with the reference-signal-input-stage-separated configuration in which the reference signal input stages of the voltage comparators 252 are separated into a plurality of blocks, one block includes one buffer circuit 280 and a plurality of voltage comparators 252. In other words, the number of voltage comparators 252 covered by one buffer circuit 280 is plural. In contrast, in the second embodiment, one buffer circuit 280 covers one voltage comparator 252, that is, each vertical column includes one buffer circuit 280 and one voltage comparator 252. Thus, the reference signal is transmitted to one comparator via one signal path. This completely individual configuration is a feature of the second embodiment.

For example, the reference signal RAMP_1 output from the buffer circuit 280_1 is transmitted via the reference signal output line 281_1 to the reference signal input stage of the voltage comparator 252a (gate at the side of the capacitor 305) and is input as the reference signal Vref_a into the voltage comparator 252a. Similarly, the reference signal RAMP_2 output from the buffer circuit 280_2 is transmitted via the reference signal output line 281_2 to the reference signal input stage of the voltage comparator 252b (gate at the side of the capacitor 305) and is input as the reference signal Vref_b into the voltage comparator 252b. Each reference signal output line 281_k may be stopped at a necessary point. Alternatively, each reference signal output line 281_k may be of the same length, as indicated by dotted lines in FIG. 14, in order to have the same amount of signal delay in each column.

Although not shown in FIG. 14, as shown in FIG. 15, the overall outline is such that the reference signal RAMP_k output from another buffer circuit 280_k is input to the reference signal input stage of the voltage comparator 252 (gate at the side of the capacitor 305) in another column via the reference signal output line 281_k.

With the reference-signal-input-stage-separated configuration in which one buffer circuit 280 and one voltage comparator 252 are disposed in each vertical column, although the number of buffer circuits 280 is greatly increased compared to the first embodiment, the reference signal line 251 and the reference signal output lines 281 (that is, all the vertical columns) are completely separated from one another using the buffer circuits 280.

Accordingly, as indicated by dotted lines and "X" at the tip of each arrow in FIG. 14, even if the noise component ΔVref is generated in the reference signal input stage of the voltage comparator 252 in a certain block (in an arbitrary column in this embodiment), this noise component ΔVref is not transmitted to the reference signal input stage of the voltage comparators 252 in the separated blocks (in all the other columns in this embodiment). Therefore, it is possible to almost completely prevent the problem of the known reference signal supply IF unit 28, that is, the problem in which, due to noise generated in the voltage comparator 252 in a certain column when the PSET signal is turned off, the reset points of the voltage comparators 252 in the other columns are varied via the reference signal line 251. Reduction of the count time of the reset potential in a pixel signal can be achieved more reliably than in the first embodiment.

With regard to the circuit scale, since the number of buffer circuits 280 is greatly increased in the second embodiment, the circuit scale is also greatly increased. In view of the circuit scale, it is more preferable to increase the number of voltage comparators 252 covered by one buffer circuit 280 as much as possible, although this is disadvantageous in terms of suppression of variation in the reset point. Thus, it is preferable to determine the number of voltage comparators 252 covered by one buffer circuit 280 by taking into consideration both the circuit scale and the suppression of variation in the reset point in the other columns.

While the present invention has been described with reference to the embodiments, it is to be understood that the technical scope of the invention is not limited to the embodiments. On the contrary, the invention is intended to cover various modifications and equivalent arrangements without departing from the spirit of the invention, and the various modifications and arrangements are encompassed within the technical scope of the invention.

The above-described embodiments do not restrict the claimed invention, and all the combinations of the features disclosed in the embodiments are not necessarily crucial as the solving means for the invention. The above-described embodiments include various modes of the invention, and by suitably combining a plurality of features disclosed in the embodiments, various inventions can be extracted. Even if some of the features disclosed in the embodiments are deleted, the resulting features can be extracted as the invention as long as they offer advantages.

For example, in the foregoing embodiments, in order to achieve the reference-signal-input-stage-separated configuration in which the reference signal input stages of the voltage comparators 252 are separated, the buffer circuits 280 are employed to separate the reference signal line 251 and the reference signal output lines 281 connected to the reference signal input stages. Alternatively, it is only necessary to separate the reference signal input stages of the voltage comparators 252 in the individual vertical columns into a plurality of blocks. As long as the reference signal input stages of the voltage comparators 252 are separated into a plurality of blocks, various modifications can be made.

Figure 16A:
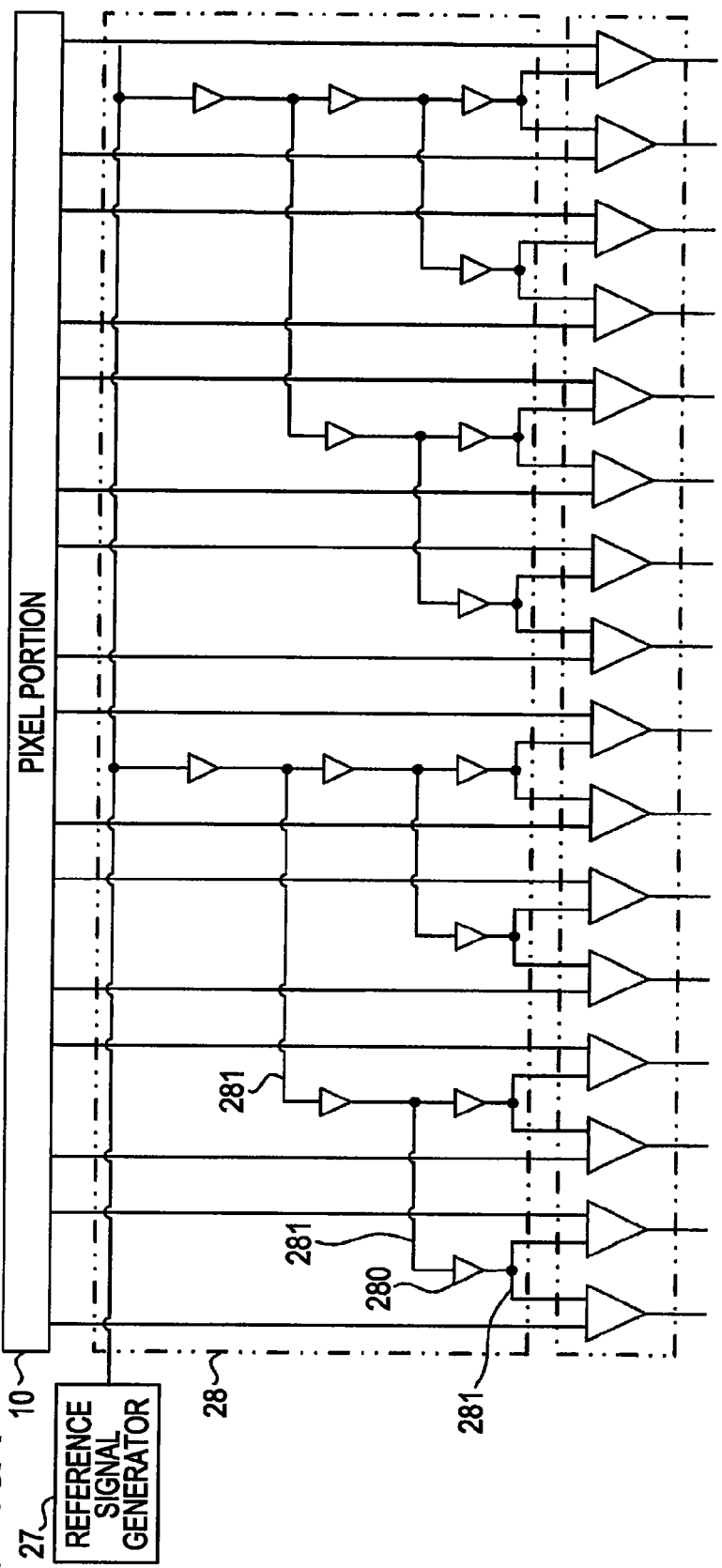
FIGS. 16A and 16B are diagrams showing the reference signal supply IF unit according to a first modification of the present invention.
Figure 16B:
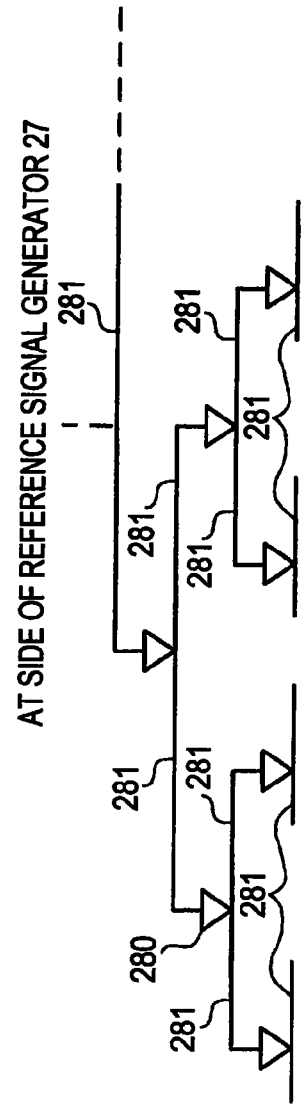

For example, as shown in a first modification shown in FIGS. 16A and 16B, the buffer circuits 280 are connected at multi-stages. Accordingly, the reference signal output lines 281 can be separated to have a tree structure. With such a tree structure, it is preferable that the reference signal output lines 281 at a lower stage near the voltage comparators 252 cover the adjacent voltage comparators 252 so that the wiring of the reference signal output lines 281 at the output side of the voltage comparators 252 is stopped at necessary points, and that the reference signal output lines 281 at an upper stage near the reference signal generator 27 have the same length so as to have the same signal delay amount.

As in the first and second embodiments described above, when the buffer circuits 280 are disposed in parallel with one another at one stage, it is necessary to have, for all the buffer circuits 280, the reference signal output lines 281 of the same length in order to have the same signal delay amount. In the first modification, however, although the number of buffer circuits 280 is increased, it is only necessary to have the reference signal output lines 281 of the same length only for the buffer circuits 280 at an upper stage near the reference signal generator 27. Therefore, the overall reference signal wiring is simplified.

More specifically, as shown in the overall outline in FIG. 16B, when the tree structure shown in FIGS. 16A and 16B is used in order to equally divide the reference signal in the device, a signal delay error (generally referred to as a "skew") of the entire circuit is restricted by the skew at a first stage in which the length of wiring is the longest. In order to minimize the skew, it is preferable to have the reference signal output lines 281 of the same length.

Figure 17A:
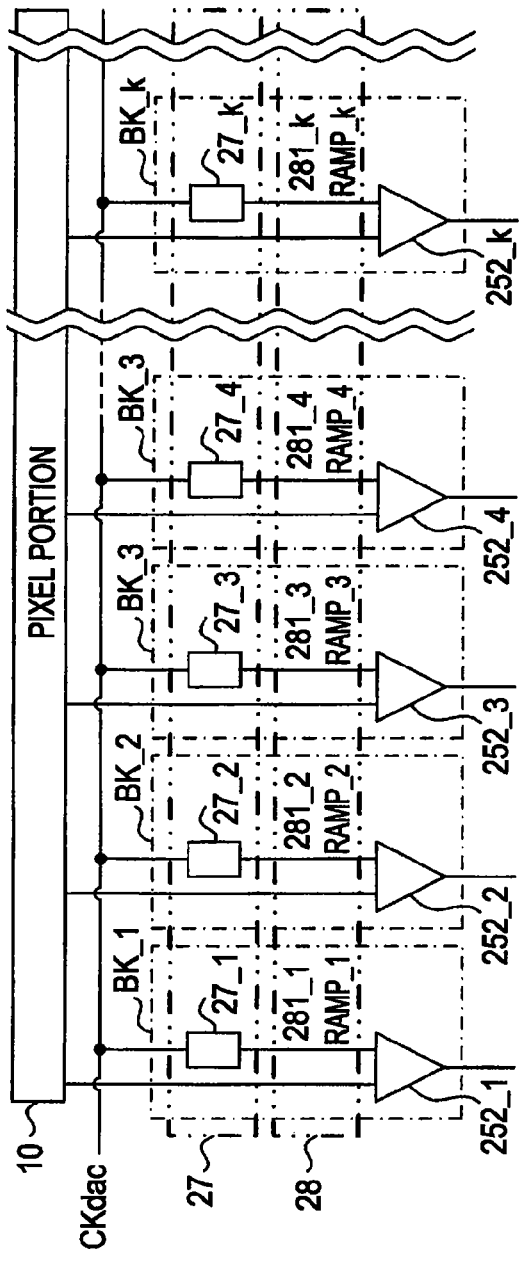
FIGS. 17A and 17B are diagrams showing the reference signal supply IF unit according to a second modification of the present invention.
Figure 17B:
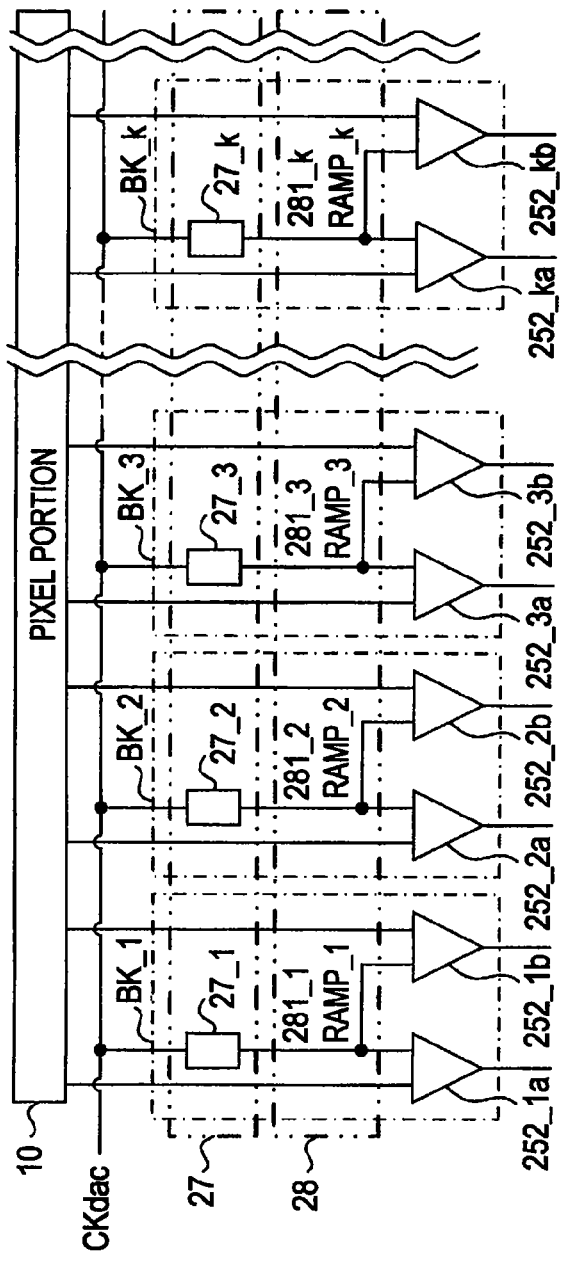

As shown by a second modification shown in FIGS. 17A and 17B, the reference signal generator 27 may be divided into a plurality of blocks. In this case, a plurality of reference signal generators 27 are disposed, and the reference signal supply IF unit 28 transmits a signal output from each reference signal generator 27 as it is.

In the second modification, with regard to the circuit scale, when one reference signal generator 27 covers one voltage comparator 252, as shown in FIG. 17A, the number of reference signal generators 27 is greatly increased, and the circuit scale is also greatly increased. In view of the circuit scale, it is more preferable to increase the number of voltage comparators 252 covered by one reference signal generator 27 as much as possible, as shown in FIG. 17B, although this is disadvantageous in terms of suppression of variation in the reset point. Thus, it is preferable to determine the number of voltage comparators 252 covered by one reference signal generator 27 by taking into consideration both the circuit scale and the suppression of variation in the reset point in the other columns.

In comparison between the case where a plurality of reference signal generators 27 are provided and the case where a plurality of buffer circuits 280 are provided, the reference signal supply IF unit 28 in the first or second embodiment is preferable because the circuit scale of the reference signal generator 27 is significantly larger than that of the buffer circuit 280.

In the embodiments described above, it has been stated that noise in the reference signal line 251 is generated by noise transmission through the reset signal PSET due to the PSET transistors 306 and 307 provided at the reference signal input stage of the voltage comparator 252. The mechanism described in the embodiments has an advantageous effect on not only such noise, but also on any type of noise, such as noise via stray capacitance, generated in the reference signal line 251.

In the embodiments described above, the CMOS solid-stage imager responsive to electromagnetic waves, such as light or radiation, input from an external source has been described by way of example. Alternatively, the mechanism described in the embodiments is applicable to any type of sensor for sensing a change in physical quantity. The embodiments are similarly applicable to, for example, a fingerprint recognition device for sensing fingerprint information or a fingerprint image on the basis of a change in electrical or optical characteristics based on the pressure (see Japanese Unexamined Patent Application Publication Nos. 2002-7984 and 2001-125734), or to the other mechanisms of sensing a change in physical quantity, particularly as a technique for preventing noise in conversion of an analog signal into a digital signal.

What is claimed is:

1. An analog-to-digital converter comprising:
    a reference signal generator;
    a comparator; and
    a counter,
    wherein,
    the reference signal generator is operable to generate a plurality of reference signals based on a rate of change in a voltage in accordance with a characteristic of a color of a color filter, a combination of predetermined colors in accordance with a color repeating cycle determined by types and arrangement of colors determines the rate of change in the voltage,
    the comparator is operable to compare the analog signal with one of the plurality of reference signals generated by the reference signal generator, and
    the counter is operable to count, in parallel with the comparison performed by the comparator, a predetermined count clock and to hold a count value at the time of completion of the comparison.

2. The analog-to-digital converter according to claim 1, wherein the rate of change in the voltage is the same between a first operation and a second operation.

3. The analog-to-digital converter according to claim 1, wherein variation characteristics of one of the plurality of reference signals and an initial value of one of the plurality of reference signals are changed by the reference signal generator in accordance with the characteristics of the color filter.

4. A driving method of an analog-to-digital converter comprising:
    generating a plurality of reference signals based on a rate of change of a voltage in accordance with a characteristic of a color of a color filter; wherein a combination of predetermined colors in accordance with a color repeating cycle determined by types and arrangement of colors determines the rate of change in the voltage,
    comparing an analog signal with of one of the plurality of reference signals generated by the reference signal generator; and
    counting, in parallel with the performed comparison, a predetermined count clock and to hold a count value at the time of completion of the comparison.

5. A solid-state imaging device, comprising:
a pixel unit;
a reference signal generator;
a comparator; and
a counter,
wherein,
the pixel unit comprises a plurality of pixels arranged in rows and columns,
the reference signal generator is operable to generate a plurality of reference signals based on a rate of change in a voltage in accordance with a characteristic of a color of a color filter, a combination of predetermined colors in accordance with a color repeating cycle determined by types and arrangement of colors determines the rate of change in the voltage,
the comparator is operable to compare the analog signal with one of the plurality of reference signals generated by the reference signal generator, and
the counter is operable to count, in parallel with the comparison performed by the comparator, a predetermined count clock and to hold a count value at the time of completion of the comparison.

6. A driving method of solid-state imaging device having a pixel unit, a reference signal generator, a comparator, and a counter, said pixel unit having a plurality of pixels arranged in rows and columns, the method comprising:
generating a plurality of reference signals based on a rate of change of a voltage in accordance with a characteristic of a color of a color filter; wherein a combination of predetermined colors in accordance with a color repeating cycle determined by types and arrangement of colors determines the rate of change in the voltage,
comparing an analog signal with of one of the plurality of reference signals generated by the reference signal generator; and
counting, in parallel with the performed comparison, a predetermined count clock and to hold a count value at the time of completion of the comparison.

* * * * *